(12) United States Patent
Matsushita et al.

(10) Patent No.: US 11,295,259 B2
(45) Date of Patent: Apr. 5, 2022

(54) WORK PLAN MANAGEMENT SYSTEM AND COMPONENT MOUNTING SYSTEM

(71) Applicant: YAMAHA HATSUDOKI KABUSHIKI KAISHA, Iwata (JP)

(72) Inventors: Yoichi Matsushita, Shizuoka (JP); Kotaro Sugiyama, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 0 days.

(21) Appl. No.: 16/969,179

(22) PCT Filed: Feb. 28, 2018

(86) PCT No.: PCT/JP2018/007462
§ 371 (c)(1),
(2) Date: Aug. 11, 2020

(87) PCT Pub. No.: WO2019/167164
PCT Pub. Date: Sep. 6, 2019

(65) Prior Publication Data
US 2020/0401974 A1    Dec. 24, 2020

(51) Int. Cl.
*G06Q 10/00* (2012.01)
*G06Q 10/06* (2012.01)
(Continued)

(52) U.S. Cl.
CPC ... *G06Q 10/06316* (2013.01); *G05B 19/4155* (2013.01); *G06Q 10/06312* (2013.01);
(Continued)

(58) Field of Classification Search
None
See application file for complete search history.

(56) References Cited

U.S. PATENT DOCUMENTS 10,474,994 B2 * 11/2019 Mak .................. G06Q 10/0875
2010/0287021 A1 * 11/2010 Jordan ................ G06Q 10/06
705/7.25
(Continued)

FOREIGN PATENT DOCUMENTS

CN         104509236 A      4/2015
JP         2012-028660 A    2/2012
(Continued)

OTHER PUBLICATIONS

Liu, Yue, Materials Discovery and Design using Machine Learning, 2017, Scienchttps://reader.elsevier.com/reader/sd/pii/S2352847817300515? D4A5&originRegion=us-east-1 &originCreation=20220111152949, p. 1-19. (Year: 2017).*
(Continued)

*Primary Examiner* — Joseph M Waesco
(74) *Attorney, Agent, or Firm* — Studebaker & Brackett PC

(57) ABSTRACT

This work plan management system is provided with a component replenishment management unit for managing a plan for component replenishment work to be performed on component supply devices; and an ancillary work management unit for managing a plan for ancillary work. The component replenishment management unit includes a component supply monitoring unit and a replenishment target specifying unit. The component supply monitoring unit specifies, for each of the component supply devices, replenishment possibility time windows during which component replenishment work is possible. The replenishment target specifying unit recognizes overlapping replenishment time windows in which the individual replenishment possibility time windows overlap, and specifies component supply devices on which it is possible to perform component replenishment work during the overlapping replenishment time windows. The ancillary work management unit speci-
(Continued)

fies ancillary work that is to be started during the overlapping replenishment time windows.

13 Claims, 13 Drawing Sheets

(51) Int. Cl.
  *G05B 19/4155* (2006.01)
  *G06Q 10/08* (2012.01)
  *G06Q 50/04* (2012.01)
  *H05K 13/02* (2006.01)
(52) U.S. Cl.
  CPC ......... *G06Q 10/0875* (2013.01); *G06Q 50/04* (2013.01); *H05K 13/02* (2013.01); *G05B 2219/36195* (2013.01)

(56) References Cited

U.S. PATENT DOCUMENTS

| | | | | |
|---|---|---|---|---|
| 2015/0134097 | A1* | 5/2015 | Maenishi | H05K 13/086 700/99 |
| 2015/0309921 | A1* | 10/2015 | Smith | G06Q 10/06 717/131 |
| 2016/0140473 | A1* | 5/2016 | Hodes | G06Q 10/06316 705/7.21 |
| 2016/0162836 | A1* | 6/2016 | Fung | G06Q 10/04 705/29 |
| 2016/0200110 | A1* | 7/2016 | Matsushita | B41J 2/18 347/85 |
| 2017/0004429 | A1* | 1/2017 | Maenishi | G06Q 10/06312 |
| 2017/0027091 | A1* | 1/2017 | Jakobsson | H05K 13/086 |
| 2017/0068239 | A1* | 3/2017 | Maenishi | G05B 19/4188 |
| 2017/0313089 | A1* | 11/2017 | Matsushita | B65D 51/20 |
| 2019/0370159 | A1* | 12/2019 | Smith | G06F 8/70 |
| 2020/0125073 | A1* | 4/2020 | Nozawa | H05K 13/086 |
| 2020/0125077 | A1* | 4/2020 | Burkhard | G05B 19/41865 |

FOREIGN PATENT DOCUMENTS

| | | |
|---|---|---|
| JP | 2013-238909 A | 11/2013 |
| JP | 2015-041733 A | 3/2015 |
| JP | 2016-225387 A | 12/2016 |
| JP | 2017-016379 A | 1/2017 |

OTHER PUBLICATIONS

International Search Report issued in PCT/JP2018/007462; dated May 1, 2018.

* cited by examiner

FIG.8

| PRODUCTION ORDER | SUBSTRATE TYPE | PRODUCTION LOT | PRODUCTION COUNT | COMPONENT ID | COMPONENT NAME | REQUIRED COMPONENT COUNT (COUNT / PIECE) | CYCLE TIME (SECOND / PIECE) |
|---|---|---|---|---|---|---|---|
| 1 | SUBSTRATE A | L1 | A1 | PIA1 | PA1 | NA1 | CT1 |
| | | | | PIA2 | PA2 | NA2 | CT2 |
| | | | | PIA3 | PA3 | NA3 | CT3 |
| | | | | PIA4 | PA4 | NA4 | CT4 |
| | | | | PIA5 | PA5 | NA5 | CT5 |
| | | | | PIA6 | PA6 | NA6 | CT6 |
| ... | ... | ... | ... | ... | ... | ... | ... |

FIG.9

| PRODUCTION ORDER | SUBSTRATE TYPE | COMPONENT SUPPLY DEVICE | | COMPONENT ID | TOTAL NUMBER OF REMAINING COMPONENTS | COMPONENT REMAINING COUNT WARNING VALUE |
|---|---|---|---|---|---|---|
| | | TYPE | DEVICE ID | | | |
| 1 | SUBSTRATE A | AF | MIA1 | PIA1 | NA11 | NW1 |
| | | AF | MIA2 | PIA2 | NA21 | NW2 |
| | | AF | MIA3 | PIA3 | NA31 | NW3 |
| | | TRAY | MIA4 | PIA4 | NA41 | NW4 |
| | | TRAY | MIA5 | PIA5 | NA51 | NW5 |
| | | STICK | MIA6 | PIA6 | NA61 | NW6 |
| ... | ... | ... | ... | ... | ... | ... |

FIG.10

| PRODUCTION ORDER (J11) | PRODUCTION STATUS (J31) | ANCILLARY WORK (J32) | | |
|---|---|---|---|---|
| | | TYPE (J321) | WORK ID (J322) | WORK DURATION (J323) |
| 1 | AA | FIRST ANCILLARY WORK | CW1 | WT1 |
| | | SECOND ANCILLARY WORK | CW2 | WT2 |
| | | THIRD ANCILLARY WORK | CW3 | WT3 |
| | | FOURTH ANCILLARY WORK | CW4 | WT4 |
| | | FIFTH ANCILLARY WORK | CW5 | WT5 |
| ... | ... | ... | ... | ... |

JH3

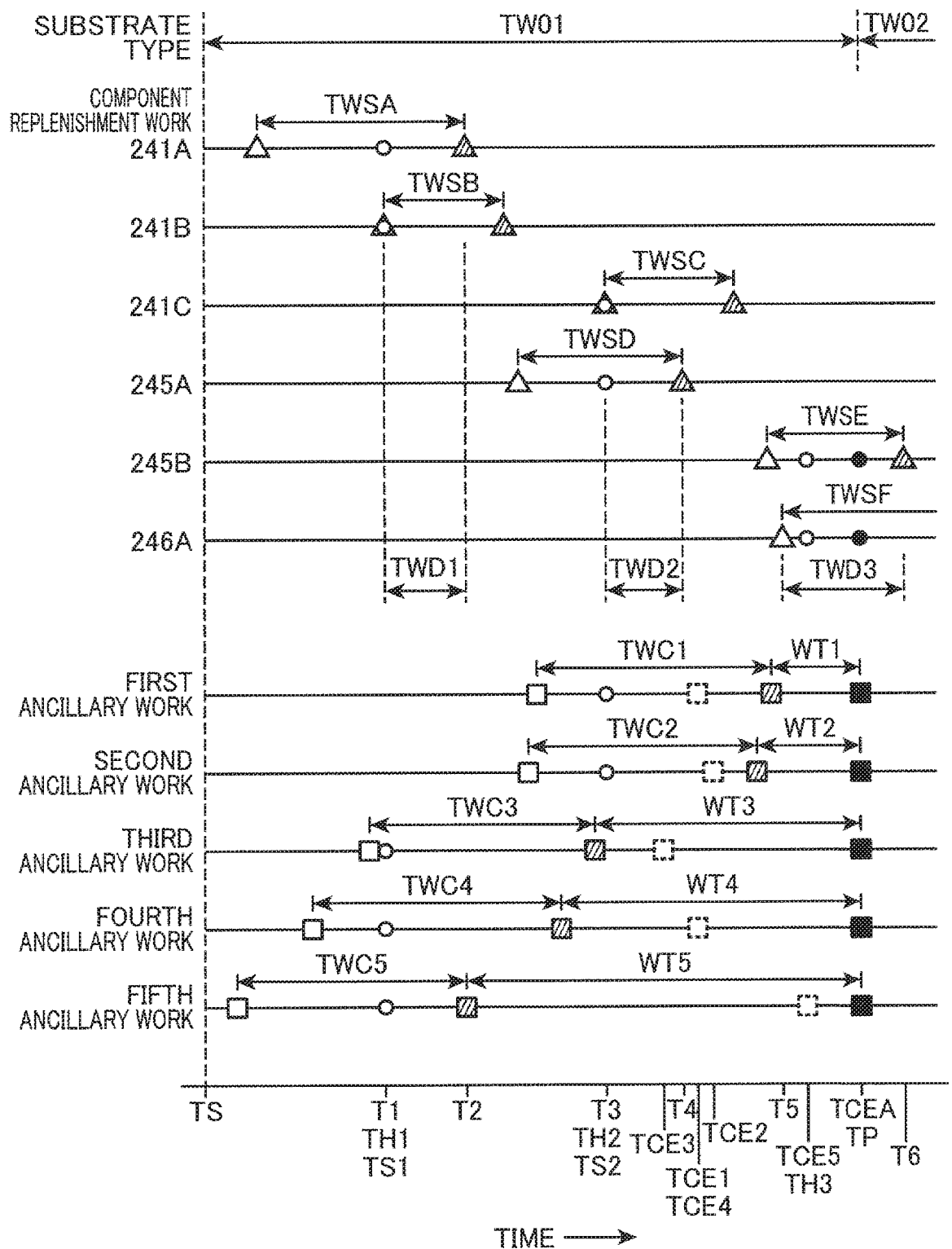

FIG.12

Component Replenishment Work (J41, JH4)

| WORK TIME (J411) | COMPONENT SUPPLY DEVICE (J21) | | COMPONENT ID (J151) | COMPONENT NAME (J152) |
|---|---|---|---|---|
| | TYPE (J211) | DEVICE ID (J212) | | |
| TH1 | AF | MIA1 | PIA1 | PA1 |
| TH1 | AF | MIA2 | PIA2 | PA2 |
| TH2 | AF | MIA3 | PIA3 | PA3 |
| TH2 | TRAY | MIA4 | PIA4 | PA4 |
| TH3 | TRAY | MIA5 | PIA5 | PA5 |
| TH3 | STICK | MIA6 | PIA6 | PA6 |

Ancillary Work (J42)

| (J421) | ANCILLARY WORK (J32) | |
|---|---|---|
| | TYPE (J321) | WORK ID (J322) |
| TS1 | THIRD ANCILLARY WORK | CW3 |
| TS1 | FOURTH ANCILLARY WORK | CW4 |
| TS1 | FIFTH ANCILLARY WORK | CW5 |
| TS2 | FIRST ANCILLARY WORK | CW1 |
| TS2 | SECOND ANCILLARY WORK | CW2 |

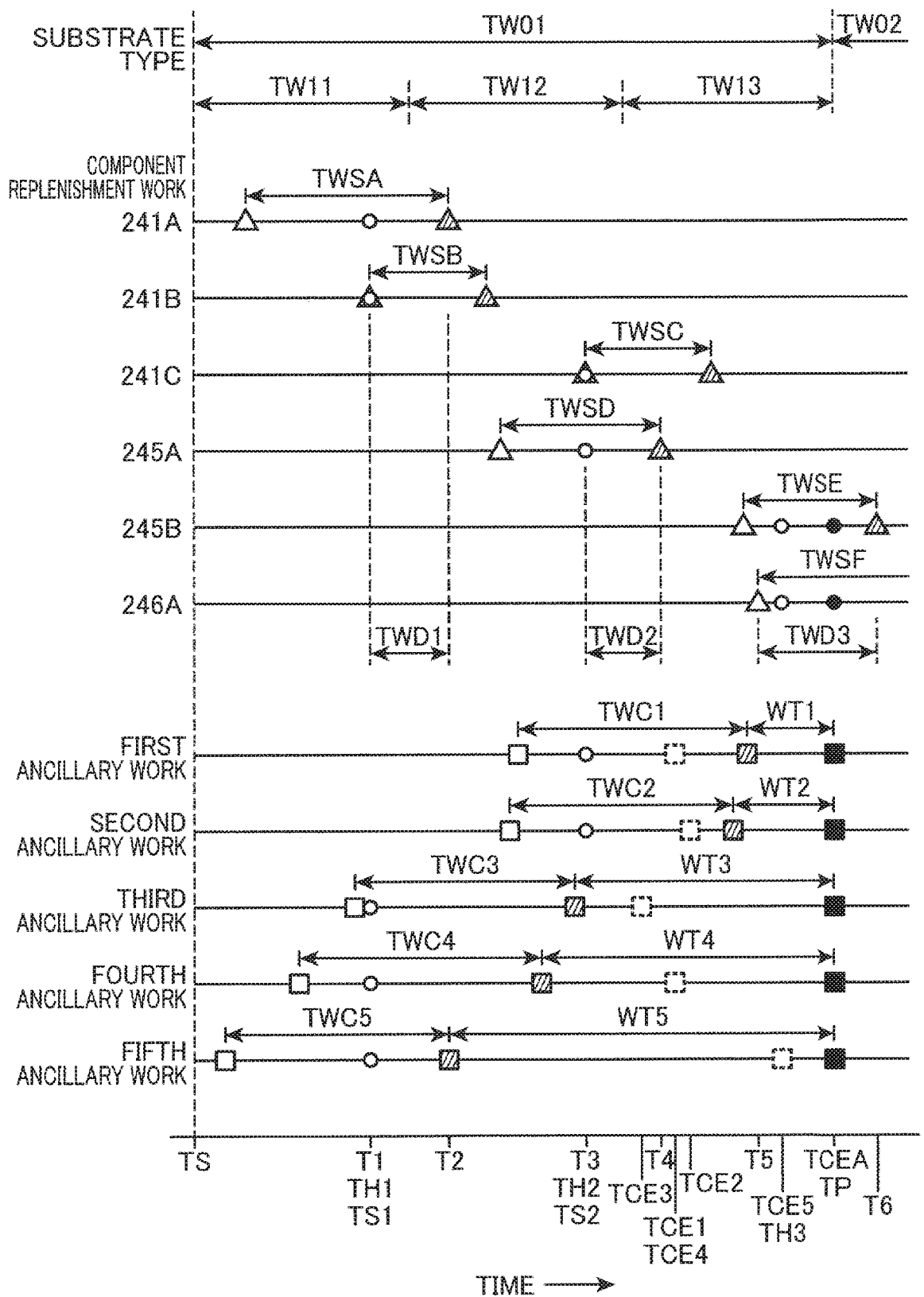

WORK PLAN MANAGEMENT SYSTEM AND COMPONENT MOUNTING SYSTEM

CROSS-REFERENCE TO RELATED APPLICATION

This application is a National Stage of International Patent Application No. PCT/JP2018/007462, filed Feb. 28, 2018, the entire content of which is incorporated herein by reference.

BACKGROUND

Technical Field

The present disclosure relates to a work plan management system that manages a plan for setup work with respect to mounters that mount components supplied from component supply devices onto a substrate, and a component mounting system provided with the same.

Background Art

Mounters that mount electronic components (hereinafter simply referred to as "components") on a substrate such as a printed wiring board to produce a component mounted substrate are provided with component supply devices capable of loading a component storage member storing the components. When producing a component mounted substrate with a mounter, setup work such as component replenishment work that replenishes a component supply device with a component storage member is performed by a worker based on a production plan for the component mounted substrate.

Technology for improving the efficiency of the component replenishment work by the worker is disclosed in Japanese Unexamined Patent Application Publication No. 2012-28660, for example. According to the technology disclosed in Japanese Unexamined Patent Application Publication No. 2012-28660, on a component mounting line where a plurality of mounters are disposed, a process of predicting a time period during which to give advance notice of a component shortage in a plurality of component supply devices (feeders) attached to each mounter is executed, and a process of allocating a worker to perform the component replenishment work in the advance notice time period of the component shortage is executed.

SUMMARY

However, according to the technology disclosed in Japanese Unexamined Patent Application Publication No. 2012-28660, the timing of the component replenishment work for each component supply device is set individually. For this reason, if one attempts to perform the component replenishment work by following the timings individually set for each component supply device, the worker frequently needs to go to the mounters where the component supply devices are attached, and must hurry from mounter to mounter. As a result, the component replenishment work imposes a large burden on the worker.

Also, the setup work performed when producing a component mounted substrate with a mounter includes not only component replenishment work, but also ancillary work such as the work of cleaning suction nozzles for holding components by suction, and the work of replacing backup pins for supporting the substrate. A worker needs to perform the ancillary work in addition to the component replenishment work. Consequently, the setup work which includes component replenishment work and ancillary work imposes a large burden on the worker.

The present disclosure has been devised in light of such circumstances, and provides a work plan management system capable of reducing the burden of setup work on the worker when producing a component mounted substrate with a mounter, as well as a component mounting system provided with the same.

A work plan management system according to an aspect of the present disclosure is a system that manages a plan for setup work for producing a component mounted substrate with respect to a mounter that produces the component mounted substrate by mounting, onto a substrate, components supplied from a plurality of attached component supply devices into which a plurality of component storage members are loadable. This work plan management system includes a component replenishment management unit that manages a plan for component replenishment work, the component replenishment work being setup work that replenishes each of the plurality of component supply devices with a new component storage member, and an ancillary work management unit that manages a plan for a plurality of ancillary work performed during the production of the component mounted substrate, the ancillary work being setup work other than the component replenishment work. The component replenishment management unit includes a component supply monitoring unit that monitors a supply status of the components in each of the plurality of component supply devices, and specifies, for each of the plurality of component supply devices, a replenishment possibility time window expressing a time window during which the component replenishment work is possible, and a replenishment target specifying unit that recognizes an overlapping replenishment time window in which the replenishment possibility time windows overlap each other, and specifies a component supply device for which the component replenishment work is possible within the overlapping replenishment time window as a component replenishment target device treated as a target of the component replenishment work. The ancillary work management unit includes a work duration specifying unit that specifies, for each of the plurality of ancillary work, a recommended work start time window expressing a time window in which the start of work is recommended, based on a work duration from a start until an end of each of the plurality of ancillary work, and a work start target specifying unit that specifies, from among the plurality of ancillary work, ancillary work for which an earliest time of the overlapping replenishment time window is included in the recommended work start time window as start target work to be started within the overlapping replenishment time window.

A component mounting system according to another aspect of the present disclosure includes a mounter that produces a component mounted substrate by mounting, onto a substrate, components supplied from a plurality of attached component supply devices into which a plurality of component storage members are loadable, and the work plan management system that manages a plan for setup work for producing the component mounted substrate with respect to the mounter.

Objects, features, and advantages of the present disclosure will be become more apparent by the following detailed description and the accompanying drawings.

BRIEF DESCRIPTION OF THE DRAWINGS

FIG. 8 is a table for explaining production plan information input into the work plan management system;

FIG. 9 is a table for explaining component replenishment work related information that is input into the work plan management system;

FIG. 10 is a table for explaining ancillary work related information that is input into the work plan management system;

FIG. 11 is a chart for explaining control operations by the work plan management system;

FIG. 12 is a diagram for explaining work plan information generated by a component replenishment management unit and an ancillary work management unit of the work plan management system; and FIG. 13 is a chart for explaining a modification of control operations by the work plan management system.

DETAILED DESCRIPTION

Hereinafter, a work plan management system and a component mounting system according to embodiments of the present disclosure will be described based on the drawings.

[Overall Configuration of Component Mounting System]

Figure 1:
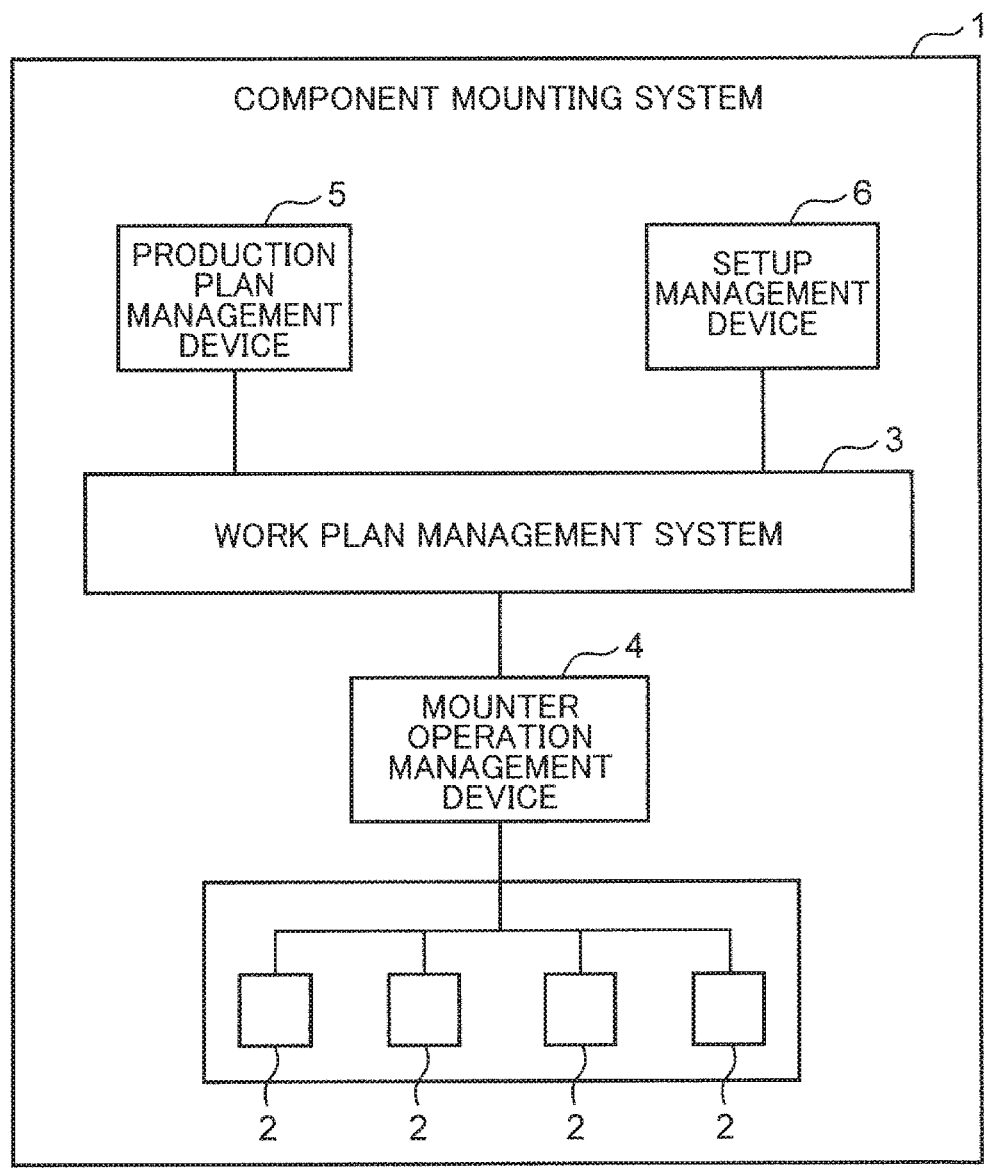
FIG. 1 is a diagram schematically illustrating a configuration of a component mounting system according to an embodiment of the present disclosure.

FIG. 1 is a diagram schematically illustrating a configuration of a component mounting system 1 according to an embodiment of the present disclosure. The component mounting system 1 is provided with mounters 2, a work plan management system 3, a mounter operation management device 4, a production plan management device 5, and a setup management device 6. In the component mounting system 1, the mounter operation management device 4, the production plan management device 5, and the setup management device 6 are management devices that are communicably connected to the work plan management system 3, and manage the production of a component mounted substrate by the mounters 2. In the component mounting system 1, a plurality of mounters 2 are disposed in parallel. Note that in the example illustrated in FIG. 1, four mounters 2 are disposed in parallel.

<Configuration of Mounter>

Figure 2:
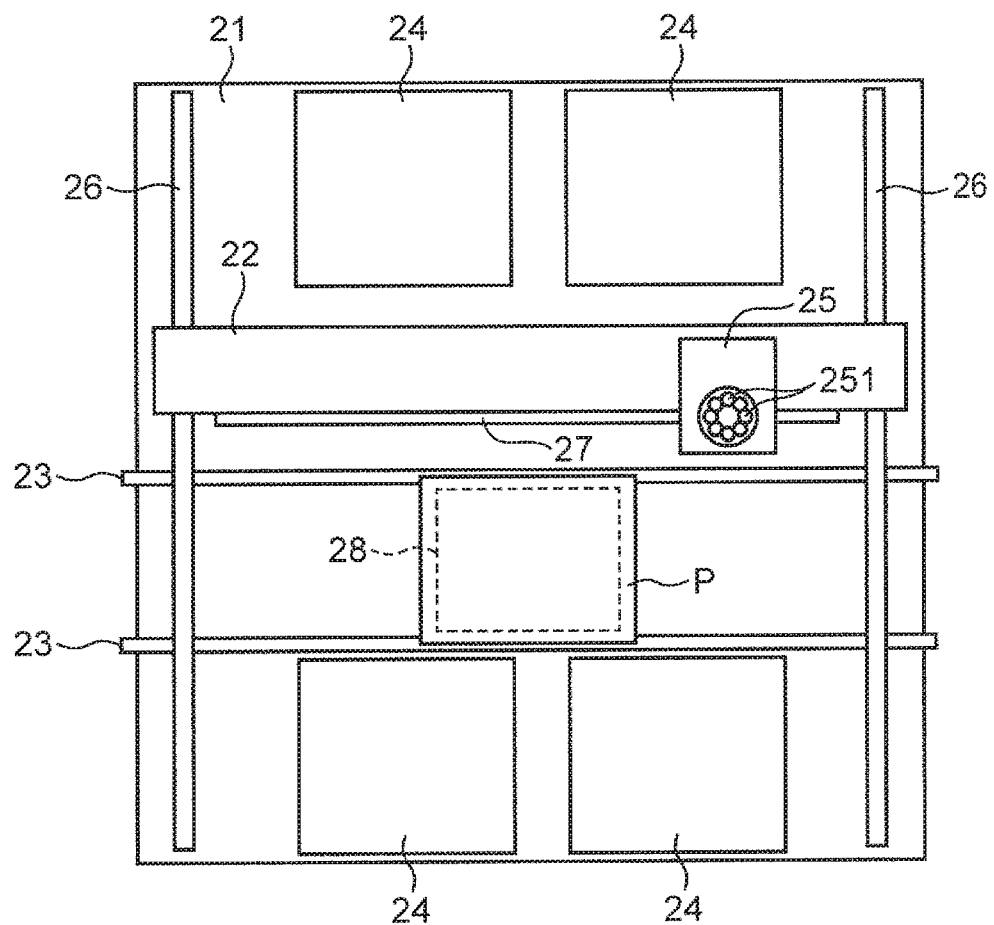
FIG. 2 is a plan view illustrating a configuration of a mounter.

First, the configuration of each mounter 2 will be described with reference to FIG. 2. FIG. 2 is a plan view illustrating a configuration of one of the mounters 2. Note that in the following, directional relationships will be described using XY orthogonal coordinate axes. The side of one direction of the X-axis direction is referred to as the "+X side", while the other side in the opposite direction of the X-axis direction is referred to as the "−X side". Likewise, the side of one direction of the Y-axis direction is referred to as the "+Y side", while the other side in the opposite direction of the Y-axis direction is referred to as the "−Y side".

The mounters 2 are devices that mount components on a substrate P to produce a component mounted substrate. Note that a pattern of solder paste is printed on the substrate P before components are mounted by the mounters 2. In other words, the mounters 2 mount components on the substrate P on which a pattern of solder paste has been printed by a pattern forming device. Each mounter 2 is provided with a body frame 21, a moving frame 22, a conveyor 23, component supply units 24, a head unit 25, a first driving mechanism 26, a second driving mechanism 27, and a substrate support device 28.

The body frame 21 is a structure on which each unit forming one of the mounters 2 is disposed, and is formed to have a substantially rectangular shape in plan view as seen from a direction orthogonal to both the X-axis direction and the Y-axis direction. The conveyor 23 is disposed on the body frame 21, extending in the X-axis direction. The conveyor 23 conveys the substrate P in the X-axis direction. The substrate P conveyed on the conveyor 23 is positioned by the substrate support device 28 to a predetermined work position (a component mounting position where components are mounted onto the substrate P). The substrate support device 28 positions the substrate P by supporting the substrate P with backup pins.

A total of four component supply units 24 are disposed two at a time in the X-axis direction in each of a region on the +Y side and the −Y side in the Y-axis direction on the body frame 21. Each component supply unit 24 supplies components to be mounted onto the substrate P, and a plurality of component supply devices are disposed in parallel. The component supply devices disposed on the component supply unit 24 will be described later.

The moving frame 22 extends in the X-axis direction and is supported by the body frame 21 to be movable in a predetermined movement direction (Y-axis direction). The head unit 25 is mounted on the moving frame 22. The head unit 25 is mounted on the moving frame 22 to be movable in the X-axis direction. In other words, the head unit 25 is capable of moving in the Y-axis direction in association with the movement of the moving frame 22, and is furthermore capable of moving in the X-axis direction along the moving frame 22. The head unit 25 is capable of moving back and forth between the component supply units 24 and the predetermined work position of the substrate P conveyed by the conveyor 23, picking up components from the component supply units 24 and also providing (mounting) the picked-up components onto the substrate P. The head unit 25 is provided with suction nozzles 251. The suction nozzles 251 are holding tools capable of using suction to hold a component supplied by the component supply unit 24. The suction nozzles 251 are communicable with any of a negative pressure generation device, a positive pressure generation device, and the atmosphere through an electric switching valve. In other words, each suction nozzle 251 is supplied with negative pressure, thereby enabling the suction nozzle 251 to hold a component (pick up a component) by suction, and thereafter, positive pressure is supplied to release the suction hold on the component.

The first driving mechanism 26 is disposed at the ends on the +X side and the −X side of the body frame 21. The first driving mechanism 26 is a mechanism that causes the moving frame 22 to move in the Y-axis direction. The first driving mechanism 26 includes a driving motor, a ball screw shaft extending in the Y-axis direction and coupled to the driving motor, and a ball nut disposed on the moving frame 22 to engage with the ball screw shaft, for example. The first driving mechanism 26 with such a configuration causes the moving frame 22 to move in the Y-axis direction by causing the ball nut to advance or retreat along the ball screw shaft in association with the rotation of the ball screw shaft driven by the driving motor.

The second driving mechanism 27 is disposed on the moving frame 22. The second driving mechanism 27 is a mechanism that causes the head unit 25 to move in the X-axis direction along the moving frame 22. Like the first driving mechanism 26, the second driving mechanism 27 includes a driving motor, a ball screw shaft extending in the X-axis direction and coupled to the driving motor, and a ball nut disposed on the head unit 25 to engage with the ball screw shaft. The second driving mechanism 27 with such a configuration causes the head unit 25 to move in the X-axis direction by causing the ball nut to advance or retreat along the ball screw shaft in association with the rotation of the ball screw shaft driven by the driving motor.

<About Component Supply Devices>

The component supply devices disposed in parallel in each component supply unit 24 are roughly categorized into tape feeders, tray feeders, and stick feeders according to differences in the component supplying method. Component supply devices of one type having the same component supplying method may be disposed in each component supply unit 24 of the mounters 2, or component supply devices of two or more types having different component supplying methods may be respectively disposed.

(Tape Feeder)

First, a tape feeder as a component supply device is configured such that component storage tape, in which components are stored at predetermined intervals, is wound around a reel as the component storage member, and the component storage tape is fed from the reel. Generally, tape feeders are roughly categorized into splicing feeders and auto-loading feeders (AFs). A splicing feeder is configured such that a single reel is loaded, and in order to switch from a preceding component storage tape to a succeeding component storage tape before the preceding component storage tape is fed completely from the reel and a component shortage occurs, splicing tape or the like is applied to join the trailing end of the preceding component storage tape to the leading end of the succeeding component storage tape. In other words, in a splicing feeder, the splicing work of applying the splicing tape or the like is performed before the component storage tape is fed completely from a single reel and a component shortage occurs, and consequently the replenishment timing for the reel around which the succeeding component storage tape is wound is restricted to the point in time when the feeding of the preceding component storage tape is completed.

On the other hand, an AF is configured such that a plurality of reels are loadable, and when the feeding of a component storage tape from a preceding reel around which a component storage tape used to supply preceding components (hereinafter referred to as the "preceding component storage tape") is wound is completed from among the plurality of reels, a component storage tape is automatically fed from a succeeding reel around which a succeeding component storage tape is wound, without performing splicing work. In other words, in an AF, the replenishment timing of a new reel is not restricted to the point in time when the feeding of the component storage tape from the preceding reel around which the preceding component storage tape is wound is completed, which provides a higher degree of freedom than a splicing feeder.

Figure 3:
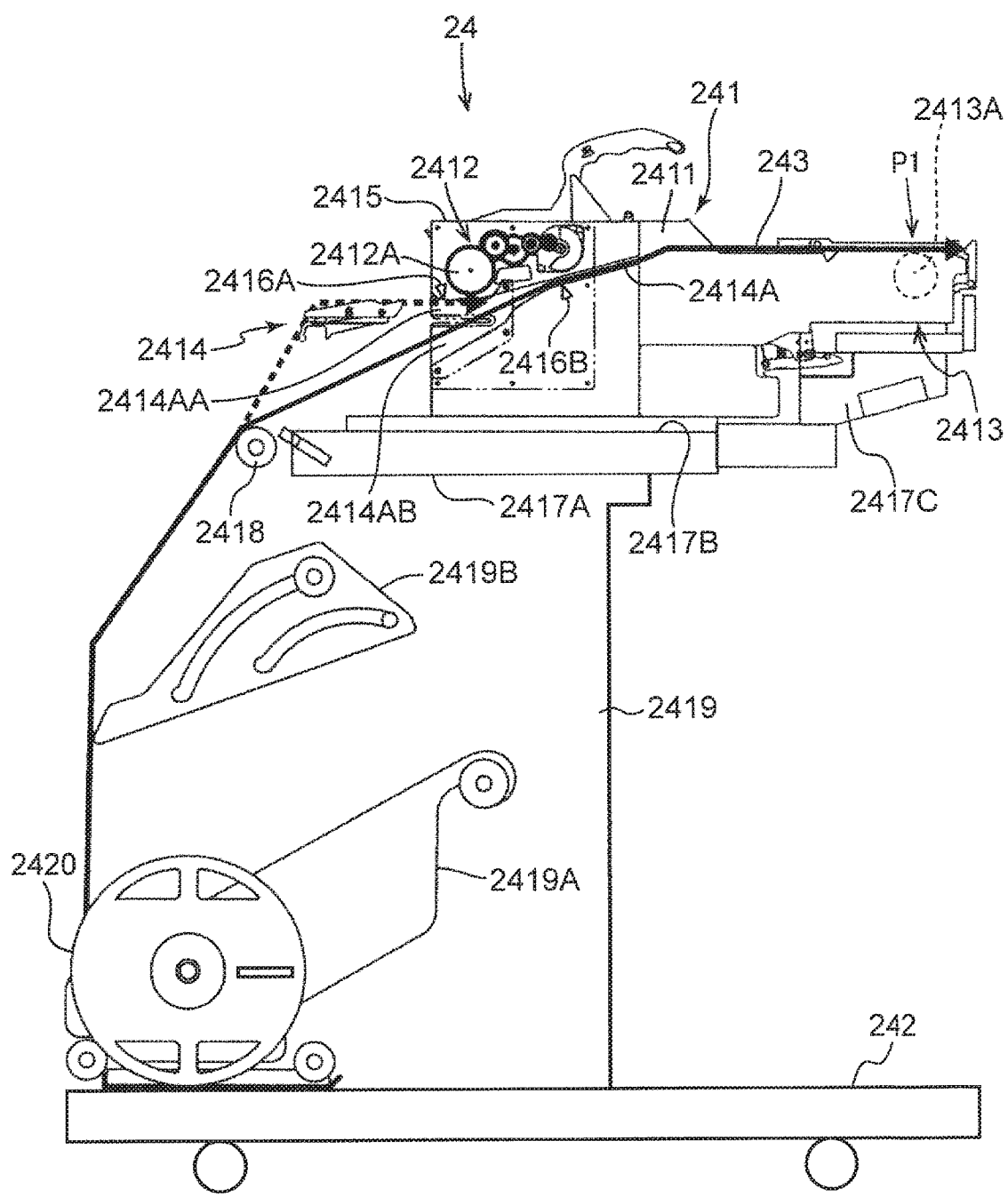
FIG. 3 is a diagram schematically illustrating a tape feeder as a component supply device disposed in a component supply unit of a mounter.
Figure 4:
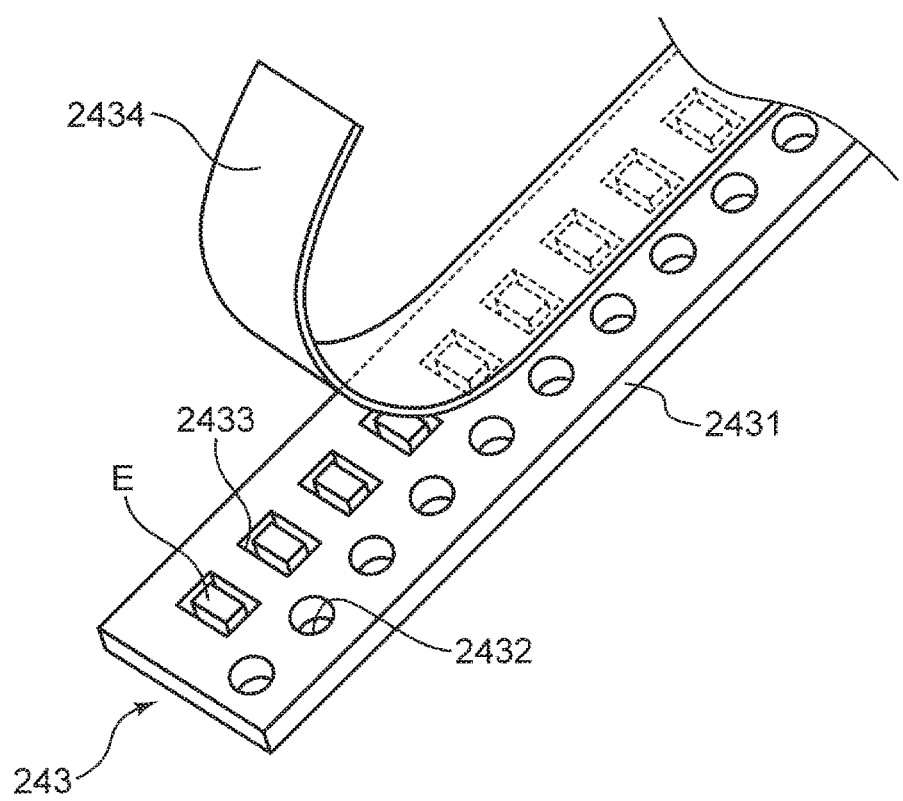
FIG. 4 is a perspective view illustrating component storage tape to be loaded into a tape feeder.

In the present embodiment, both splicing feeders and AFs may coexist as the tap feeders disposed in the component supply units 24, but a plurality of AFs capable of loading multiple reels as the component storage member are disposed as the component supply devices. FIGS. 3 and 4 will be referenced to describe a tape feeder containing an AF as the component supply device. FIG. 3 is a diagram schematically illustrating a configuration of an AF 241, and FIG. 4 is a perspective view illustrating component storage tape 243 loaded into the AF 241.

In the component supply unit 24, the AFs 241 are disposed in a wheeled platform 242. The AFs 241 are capable of loading a plurality of reels 2420 around which the component storage tape 243 is wound.

Before describing the configuration of the AFs 241, the component storage tape 243 will be described with reference to FIG. 4. The component storage tape 243 includes a carrier tape 2431 and a cover tape 2434. The carrier tape 2431 is a tape in which a plurality of component compartments 2433 storing components E are arranged at predetermined intervals. Also, along one end in the width direction of the carrier tape 2431, a plurality of conveying force transfer holes 2432 are arranged at predetermined intervals. The plurality of conveying force transfer holes 2432 engage with the teeth of a first sprocket 2412A and a second sprocket 2413A in the AFs 241 described later, and from first sprocket 2412A and the second sprocket 2413A receive the transfer of a conveying force for feeding the component storage tape 243. The cover tape 2434 is a tape applied to the carrier tape 2431 to cover the component compartments 2433.

As illustrated in FIG. 3, the AFs 241 are attached to a feeder attaching part 2417A provided in each component supply unit 24. More specifically, each component supply unit 24 is provided with the feeder attaching part 2417A and a reel support part 2419. The feeder attaching part 2417A is provided with a plurality of slots 2417B arranged at fixed intervals in the X-axis direction and extending parallel to each other in the Y-axis direction, and a fixed base 2417C positioned farther forward than the slots 2417B and extending in the X-axis direction. Additionally, an AF 241 is set in each slot 2417B, and each AF 241 is affixed to the fixed base 2417C. With this arrangement, the plurality of AFs 241 are disposed in parallel on the wheeled platform 242 in each component supply unit 24.

The reel support part 2419 is positioned behind and below the feeder attaching part 2417A, and supports a first reel holder 2419A and a second reel holder 2419B that rotatably support the reels 2420, such that the first and second reel holders are separated from each other in the vertical direction. The component storage tape 243 is wound around the reels 2420 supported by each of the first reel holder 2419A and the second reel holder 2419B.

Each AF 241 is provided with a feeder body 2411. Each AF 241 is affixed to the fixed base 2417C with the feeder body 2411 inserted (set) into one of the slots 2417B. The first sprocket 2412A that forms a first tape feeding part 2412 and the second sprocket 2413A that forms a second tape feeding part 2413 are rotatably supported on the feeder body 2411, such that the second sprocket 2413A is separated farther away in the Y-axis direction from the reel support part 2419 with respect to the first sprocket 2412A. The first sprocket 2412A and the second sprocket 2413A are each provided with a plurality of teeth arranged at predetermined intervals in the circumferential direction. The teeth of the first sprocket 2412A and the second sprocket 2413A are engageable with the conveying force transfer holes 2432 formed in the carrier tape 2431 of the component storage tape 243.

The component storage tape 243 wound around the reels 2420 supported by each of the first reel holder 2419A and the second reel holder 2419B is led to the first sprocket 2412A and the second sprocket 2413A while being guided by a guide roller 2418 disposed at the upper end of the reel support part 2419. The component storage tape 243, whose conveying force transfer holes 2432 are engaged with the teeth of the first sprocket 2412A and the second sprocket 2413A, is fed by the rotation of the first sprocket 2412A and the second sprocket 2413A, and the components E are picked up at a component supply position P1.

In addition, each AF 241 is provided with a tape support member 2414 detachably affixed to the rear end of the feeder body 2411, an operation input unit 2415 disposed on the rear top face of the feeder body 2411, and first and second tape detecting sensors 2416A and 2416B.

As illustrated in FIG. 3, the tape support member 2414 divides the rear end portion of a tape travel passage 2414A where the component storage tape 243 travels inside the feeder body 2411 into two upper and lower passages (an upper passage 2414AA and a lower passage 2414AB), and also supports the component storage tape 243 passing through the upper passage 2414AA from below. More specifically, the rear end portion of the tape travel passage 2414A has a shape that expands vertically going from the front to the rear. The tape support member 2414 is inserted into the tape travel passage 2414A from the rear of the feeder body 2411, and is detachably affixed to the feeder body 2411. With this arrangement, the rear end portion of the tape travel passage 2414A is divided into the upper passage 2414AA and the lower passage 2414AB by the tape support member 2414.

The first tape detecting sensor 2416A and the second tape detecting sensor 2416B are provided in a state facing the tape travel passage 2414A, and detect the presence or absence of the component storage tape 243 that passes through the tape travel passage 2414A. More specifically, the first tape detecting sensor 2416A is provided at a position farther forward than a point where the upper passage 2414AA and the lower passage 2414AB merge, facing the tape travel passage 2414A from below. On the other hand, the second tape detecting sensor 2416B is provided at a position facing the upper passage 2414AA from above, and thereby detects the presence or absence of the component storage tape 243 in the upper passage 2414AA.

The operation input unit 2415 used by a worker to feed or reverse-feed the component storage tape 243 as necessary.

The component supply operations of the AFs 241 configured like the above are as follows. First, as preparatory work, a worker attaches a reel 2420 around which a preceding component storage tape 243 is wound to the first reel holder 2419A in the lower section of the reel support part 2419, and inserts the leading end of the component storage tape 243 wound around the reel 2420 into the upper passage 2414AA from the rear of the feeder body 2411. With this arrangement, the leading end of the preceding component storage tape 243 is supported by the tape support member 2414 while being engaged with the first sprocket 2412A. After that, the worker operates the operation input unit 2415 to input an instruction for rotating the first sprocket 2412A, which feeds the component storage tape 243 and causes the leading end of the component storage tape 243 to engage with the second sprocket 2413A.

The component supply operations of the AFs 241 are started in the state in which the above preparatory work has been finished. In each AF 241, the second sprocket 2413A rotates, thereby feeding the component storage tape 243. Note that the first sprocket 2412A is configured to spin freely, and in this case, the component storage tape 243 can be fed by causing only the second sprocket 2413A to rotate.

Next, while the preceding component storage tape 243 is being fed from the reel 2420, the worker removes the tape support member 2414 from the feeder body 2411. When the tape support member 2414 is removed, the component storage tape 243 is displaced by its own weight to the bottom part of the tape travel passage 2414A. With this arrangement, the preceding component storage tape 243 is disengaged from the first sprocket 2412A. Because the component storage tape 243 is engaged with the second sprocket 2413A at this time, the component storage tape 243 continues to be fed by the rotation of the second sprocket 2413A even if disengaged from the first sprocket 2412A.

Next, while the preceding component storage tape 243 is being feed from the reel 2420, the worker loads the tape support member 2414 into the feeder body 2411, and moves the reel 2420 around which the preceding component storage tape 243 is wound from the first reel holder 2419A in the lower section to the second reel holder 2419B in the upper section. Next, while the preceding component storage tape 243 is being fed from the reel 2420 supported by the second reel holder 2419B in the upper section, the worker attaches a reel 2420 around which a succeeding component storage tape 243 is wound to the first reel holder 2419A in the lower section, and inserts the leading end of the component storage tape 243 into the upper passage 2414AA from the rear of the feeder body 2411. With this arrangement, the leading end of the succeeding component storage tape 243 is supported by the tape support member 2414 while being engaged with the first sprocket 2412. Accordingly, a reel 2420 around which the succeeding component storage tape 243 is wound can be loaded before a component shortage occurs in the preceding component storage tape 243 wound around a reel 2420.

After that, the preceding component storage tape 243 is completely drawn out from the reel 2420 supported by the second reel holder 2419B in the upper section, and when the trailing end passes through the position of the second tape detecting sensor 2416B and it is detected that no more preceding component storage tape 243 exists, the feeding of the succeeding component storage tape 243 from the reel 2420 supported by the first reel holder 2419A in the lower section is started automatically. Additionally, the worker removes the reel 2420 that has run out of components from the second reel holder 2419B in the upper section, and moves the reel 2420 around which the succeeding component storage tape 243 is wound from the first reel holder 2419A in the lower section to the second reel holder 2419B in the upper section. At this time, the worker can replenish the AF 241 with a new reel around which the component storage tape 243 is wound. The new reel replenishing the AF 241 is attached to the first reel holder 2419A in the lower section by the worker. Here, the timing of the component replenishment work of the new reel is not restricted to the point in time when the reel 2420 around which the preceding component storage tape 243 is wound runs out of components, but rather is specified by the work plan management system 3.

Note that in the state, in which the preceding component storage tape 243 is fed from the reel 2420 supported by the second reel holder 2419B in the upper section and the leading end of the succeeding component storage tape 243 wound around the reel 2420 supported by the first reel holder 2419A in the lower section is inserted into the upper passage 2414AA, a new reel cannot be loaded. On the other hand, in the state, in which the preceding component storage tape 243 has been completely drawn out from the reel 2420 supported by the second reel holder 2419B in the upper section and the feeding of the succeeding component storage tape 243 from the reel 2420 supported by the first reel holder 2419A in the lower section has started automatically, a new reel can be loaded.

(Tray Feeder)

Figure 5:
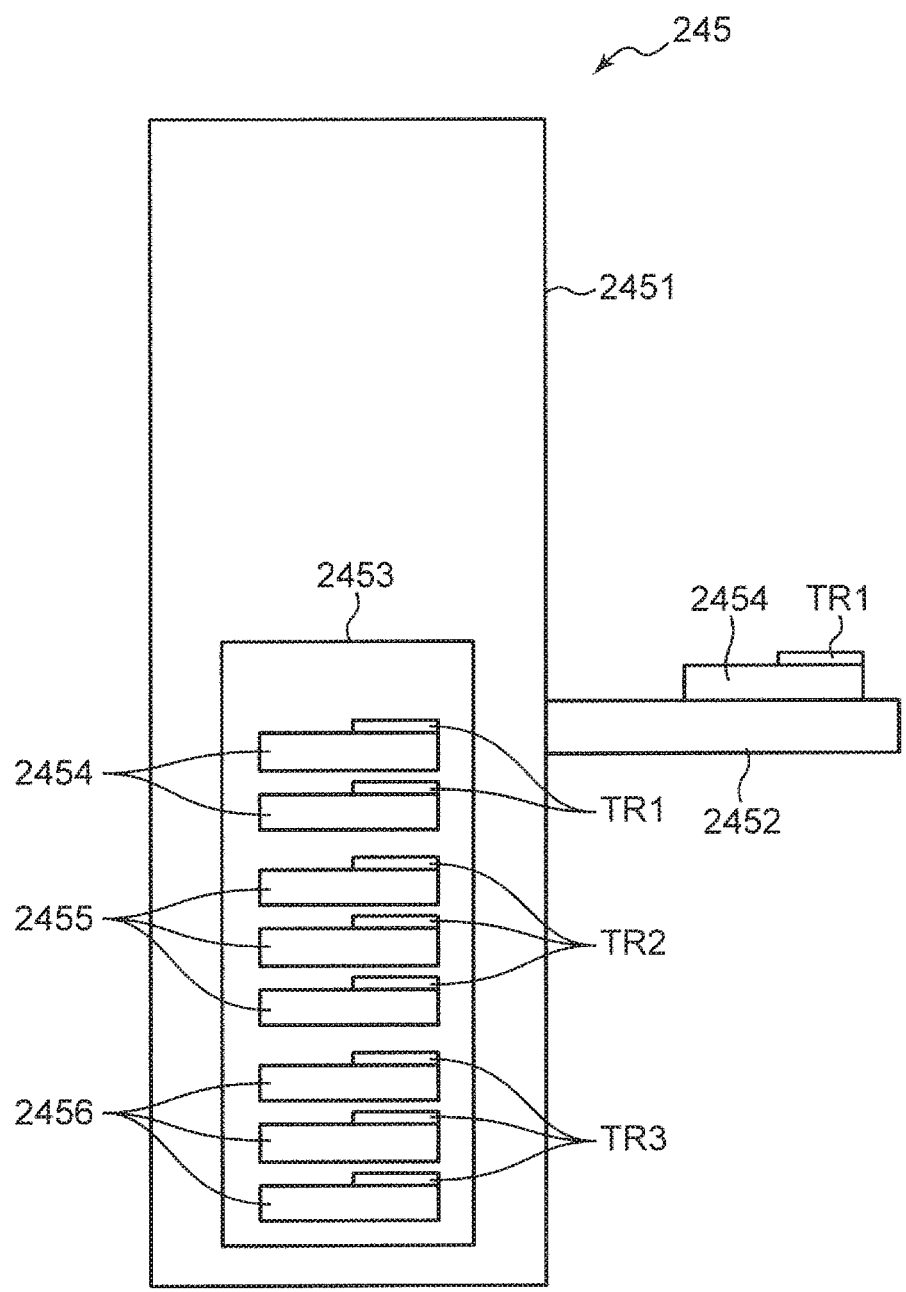
FIG. 5 is a diagram schematically illustrating a tray feeder as a component supply device disposed in a component supply unit of a mounter.

Next, a tray feeder as the component supply device will be described with reference to FIG. 5. FIG. 5 is a diagram schematically illustrating a configuration of a tray feeder 245. A plurality of tray feeders 245 can be disposed in parallel in the component supply unit 24. The tray feeder 245 is configured such that a single magazine 2453 is movable in the vertical direction inside a cover body 2451. The magazine 2453 houses a plurality of first pallets 2454, a plurality of second pallets 2455, and a plurality of third pallets 2456.

On each of the first pallets 2454, at least one first tray TR1 holding a plurality of components is placed. The components held in the first tray TR1 are the same type of component for each first pallet 2454. Similarly, on each of the second pallets 2455, at least one second tray TR2 holding a plurality of components is placed. The components held in the second tray TR2 are the same type of component for each second pallet 2455. However, the components held in the second tray TR2 are a different type of component from the components held in the first tray TR1. Also, on each of the third pallets 2456, at least one third tray TR3 holding a plurality of components is placed. The components held in the third tray TR3 are the same type of component for each third pallet 2456. However, the components held in the third tray TR3 are a different type of component from the components held in each of the first tray TR1 and the second tray TR2.

Each of the first pallets 2454, the second pallets 2455, and the third pallets 2456 functions as a component storage member on which the trays TR1, TR2, and TR3 holding a plurality of components are placed, respectively. When producing a component mounted substrate, each of the first pallets 2454, the second pallets 2455, and the third pallets 2456 housed in the magazine 2453 is moved to a table 2452 provided projecting outward from the cover body 2451, thereby supplying the components held in the trays TR1, TR2, and TR3.

During the production of the component mounted substrate, even if the components held in the first tray TR1 placed on one of the first pallets 2454 among the plurality of first pallets 2454 runs out, another first pallet 2454 is moved to the table 2452, thereby supplying components held in the first tray TR1. At this time, during the production of the component mounted substrate, a worker is able to remove the first pallet 2454 that has run out of components from the cover body 2451, and replenish the tray feeder 245 with a new first pallet. Similarly, during the production of the component mounted substrate, even if the components held in the second tray TR2 placed on one of the second pallets 2455 among the plurality of second pallets 2455 runs out, another second pallet 2455 is moved to the table 2452, thereby supplying components held in the second tray TR2. At this time, during the production of the component mounted substrate, a worker is able to remove the second pallet 2455 that has run out of components from the cover body 2451, and replenish the tray feeder 245 with a new second pallet. Also, during the production of the component mounted substrate, even if the components held in the third tray TR3 placed on one of the third pallets 2456 among the plurality of third pallets 2456 runs out, another third pallet 2456 is moved to the table 2452, thereby supplying components held in the third tray TR3. At this time, during the production of the component mounted substrate, a worker is able to remove the third pallet 2456 that has run out of components from the cover body 2451, and replenish the tray feeder 245 with a new third pallet.

Management related to a plan for replenishing the tray feeder 245 with components from new pallets is performed by the work plan management system 3.

(Stick Feeder)

Figure 6:
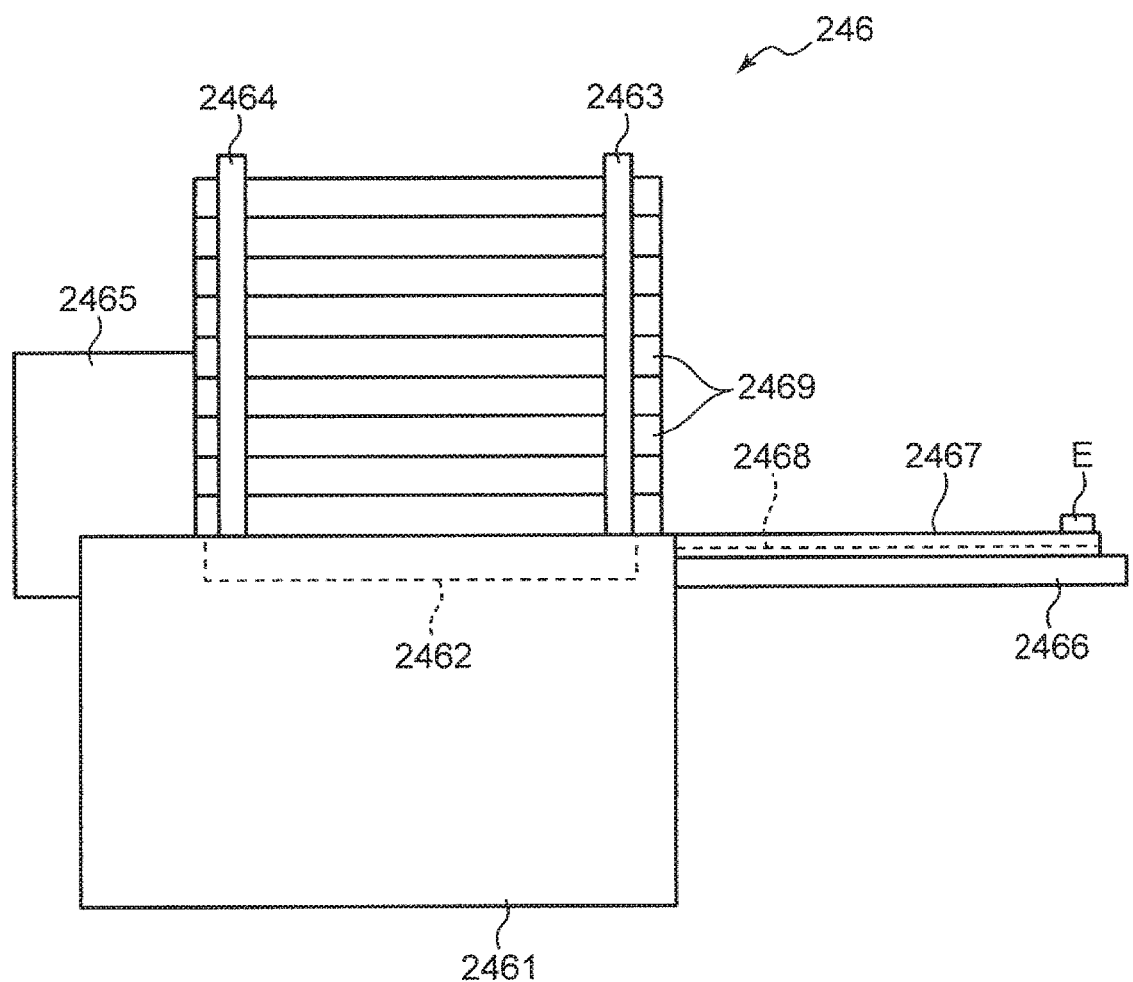
FIG. 6 is a diagram schematically illustrating a stick feeder as a component supply device disposed in a component supply unit of a mounter.

Next, a stick feeder as the component supply device will be described with reference to FIG. 6. FIG. 6 is a diagram schematically illustrating a configuration of a stick feeder 246. A plurality of stick feeders 246 can be disposed in parallel in the component supply unit 24. The stick feeder 246 is configured to supply components E stored in a stick 2469 as a cylindrical component storage member while pushing out the components E from the stick 2469. The stick feeder 246 is provided with a frame body 2461, a stick table 2462 provided in an upper part of the frame body 2461, a first chuck 2463, a second chuck 2464, a component pushing mechanism 2465, a guide frame 2466, a pair of guide rails 2467, and a conveyor belt 2468.

The frame body 2461 is shaped like an empty box open on the top. The stick table 2462 is disposed inside the upper part of the frame body 2461. A plurality of sticks 2469 can be stacked on top of the stick table 2462. The first chuck 2463 is capable of holding the leading ends of the plurality of sticks 2469 other than the lowest stick 2469 on top of the stick table 2462 at the same time. Similarly, the second chuck 2464 is capable of holding the trailing ends of the plurality of sticks 2469 other than the lowest stick 2469 on top of the stick table 2462 at the same time.

The component pushing mechanism 2465 pushes out the components E from the front of the lowest stick 2469 among the plurality of sticks 2469 on top of the stick table 2462. The guide frame 2466 is affixed to a front part of the frame body 2461, and the pair of guide rails 2467 are supported by the guide frame 2466. Additionally, the conveyor belt 2468 is provided between the pair of guide rails 2467. The components E pushed out to the front by the component pushing mechanism 2465 are conveyed by the conveyor belt 2468 along the pair of guide rails 2467. With this arrangement, the components E stored in the stick 2469 are supplied to a component supply position.

If the lowest stick 2469 runs out of components in association with the component supply operations, the first and second chucks 2463 and 2464 hold a stick 2469 other than the lowest. In this state, the stick table 2462 is displaced to a support release position that releases the support of the stick 2469, thereby causing the lowest stick 2469 to fall by its own weight to the bottom inside the frame body 2461. Note that after disposing of the stick 2469 that has run out of components, the stick table 2462 returns to the support position for supporting a stick 2469 while the first and second chucks 2463 and 2464 are opened, thereby causing the remaining sticks 2469 to be placed on top of the stick table 2462, and supplying the components E from the next (lowest) stick 2469.

During the production of the component mounted substrate, if a stick 2469 that has run out of components falls to the bottom inside the frame body 2461, a worker is able to replenish the stick feeder 246 with a new stick.

Management related to a plan for replenishing the stick feeder 246 with components from new sticks is performed by the work plan management system 3.

[Configuration of Work Plan Management System]

The work plan management system 3 is a system that manages a plan for setup work for producing a component mounted substrate with respect to the mounters 2. The setup work includes component replenishment work that replenishes each of the plurality of component supply devices disposed in the component supply units 24 with new component storage members, and a plurality of ancillary work other than the component replenishment work. The component replenishment work includes the work of replenishing the AFs 241 with new reels, the work of replenishing the tray feeders 245 with new pallets, and the work of replenishing the stick feeders 246 with new sticks.

Examples of the ancillary work include the work of creating a mega reel (combined reel), tray baking work, solder paste mixing work, suction nozzle cleaning work, and backup pin preparation work. The work of creating a mega reel is the work of creating a reel around which component storage tape storing a large number of components is wound, the reel being loadable into the AFs 241. Specifically, two reels around which the component storage tape is wound are prepared, the leading end of the component storage tape on a first reel is joined to the leading end of the component storage tape on the other reel, and by winding up the component storage tape of the other reel onto the first reel, a single reel (mega reel) is created. The tray baking work is the work of baking the trays on which pallets that can be loaded into the tray feeders 245 are placed. Baking the trays using tool such as a heating device removes moisture and the like adhering to the trays. The solder paste mixing work is the work of preparing the solder paste to be printed onto the substrate P before mounting components, and is the work of mixing the solder paste using a tool such as a mixer. The suction nozzle cleaning work is related to the suction nozzles 251 provided on the head unit 25, and is the work of cleaning and preparing a suction nozzle 251 suited to holding components for each substrate type. The backup pin preparation work is related to the backup pins provided in the substrate support device 28, and is the work of preparing backup pins suited to supporting the substrate P for each substrate type.

Figure 7:
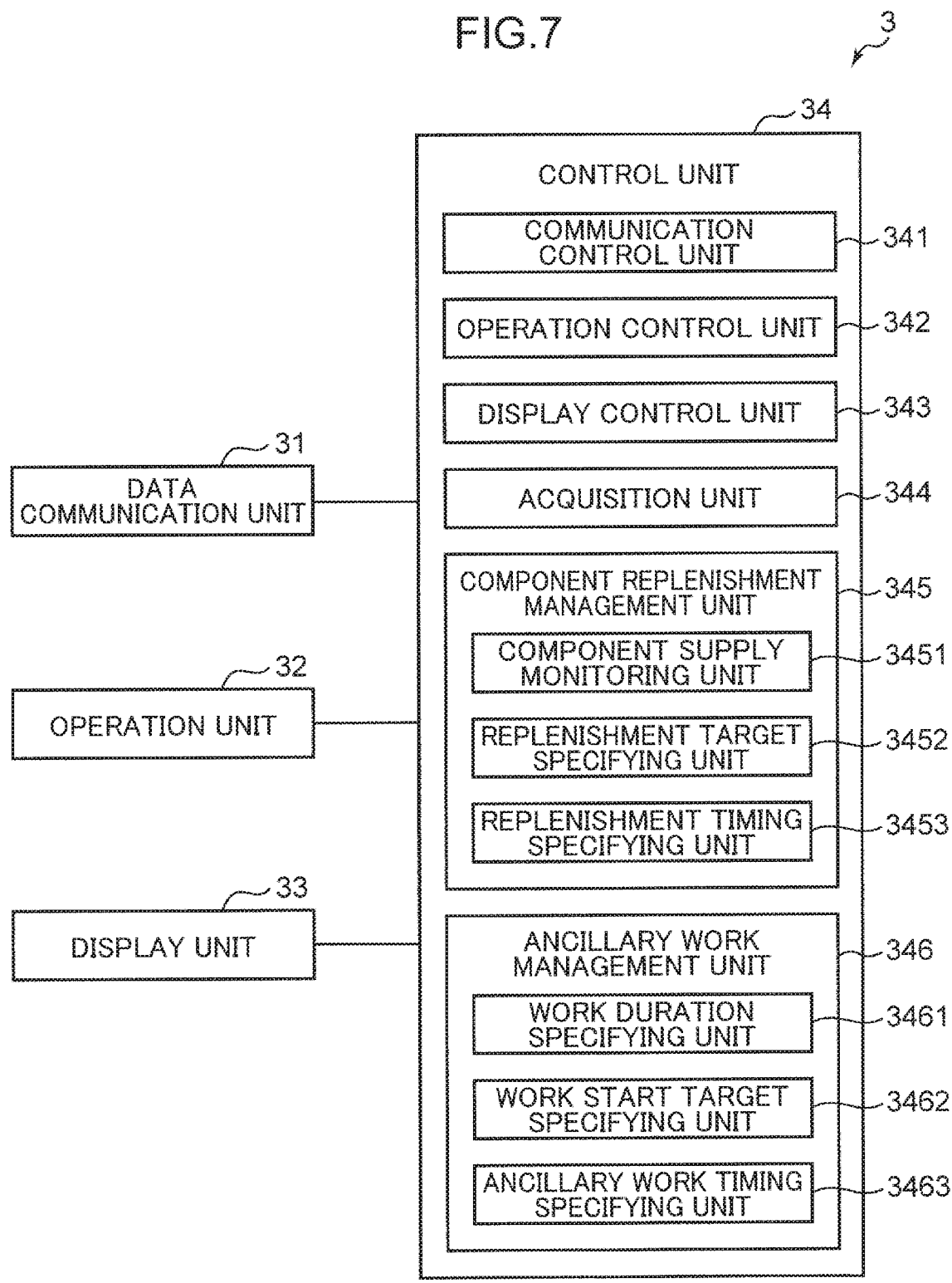
FIG. 7 is a block diagram illustrating a configuration of a work plan management system.

FIG. 7 is a block diagram illustrating a configuration of the work plan management system 3. As illustrated in FIG. 1, in the work plan management system 3, a mounter operation management device 4, a production plan management device 5, and a setup management device 6 are communicably connected to each other. In addition, the work plan management system 3 includes a microcontroller for example, and as illustrated in FIG. 7, is provided with a data communication unit 31, an operation unit 32, a display unit 33, and a control unit 34.

The operation unit 32 is provided with elements such as a touch panel, a keypad, a start key, and a settings key, and receives worker operations and various settings with respect to the work plan management system 3. The display unit 33 displays work plan information generated by a component replenishment management unit 345 and an ancillary work management unit 346 of the control unit 34 described later. The data communication unit 31 is an interface circuit for achieving data communication with the mounter operation management device 4, the production plan management device 5, and the setup management device 6. The data communication unit 31 acquires information transmitted from the mounter operation management device 4, the production plan management device 5, and the setup management device 6, and supplies the acquired information to the control unit 34. Additionally, the control unit 34 supplies the data communication unit 31 with work plan information generated by the component replenishment management unit 345 and the ancillary work management unit 346, and the data communication unit 31 transmits (outputs) the work plan information to the mounter operation management device 4, the production plan management device 5, and the setup management device 6.

At this point, the mounter operation management device 4, the production plan management device 5, and the setup management device 6 communicably connected to the work plan management system 3 will be described.

The mounter operation management device 4 is installed near the component mounted substrate production line where the mounters 2 are disposed, and is a device for managing the component mounting operations by the mounters 2. The mounter operation management device 4 contains a microcontroller, for example. A worker on the production line operates the mounter operation management device 4 to control the component mounting operations by the mounters 2. In accordance with an operation by the worker on the production line, the mounter operation management device 4 transmits component remaining count information related to the total number of remaining components E in each AF 241, each tray feeder 245, and each stick feeder 246 to the work plan management system 3. The component remaining count information of the AF 241 is information related to the total number of remaining components E stored in the component storage tape 243 wound around the reels 2420 respectively loaded into the first reel holder 2419A and the second reel holder 2419B. The component remaining count information regarding the tray feeders 245 is information related to the total number of remaining components stored in each first tray TR1 of the plurality of first pallets 2454, the total number of remaining components stored in each second tray TR2 of the plurality of second pallets 2455, and the total number of remaining components stored in each third tray TR3 of the plurality of third pallets 2456. The component remaining count information regarding the stick feeders 246 is information related to the total number of remaining components E stored in each of the plurality of sticks 2469 placed on the stick table 2462.

The component remaining count information transmitted from the mounter operation management device 4 is input into the work plan management system 3 through the data communication unit 31. Note that the component remaining count information may also be transmitted from the setup management device 6 described later. Also, work plan information, which is generated by the component replenishment management unit 345 and the ancillary work management unit 346 described later, and which is transmitted from the work plan management system 3 through the data communication unit 31, is input into the mounter operation management device 4. The worker on the production line performs the setup work for producing the component mounted substrate using the mounters 2, based on the work plan information input into the mounter operation management device 4.

The production plan management device 5 is a device for managing a component mounted substrate production plan followed by the mounters 2. The production plan management device 5 contains a microcontroller, for example. In accordance with an operation by a worker who drafts a production plan, the production plan management device 5 transmits production plan information related to a component mounted substrate production plan to the work plan management system 3. FIG. 8 is a table for explaining production plan information JH1 that is transmitted from the production plan management device 5 and input into the work plan management system 3. The production plan information JH1 is information that includes at least required component count information J153 and cycle time information J154. The required component count information J153 is information related to the required number of components E needed to produce a single component mounted substrate (parts per board). The cycle time information J154 is information related to the time taken to mount the components E during the production of a single component mounted substrate (seconds per board).

Specifically, as illustrated in FIG. 8, the production plan information JH1 is information associating production order information J11, substrate type information J12, production lot information J13, production count information J14, and used component information J15. The production order information J11 is information expressing a production order of the component mounted substrate. The substrate type information J12 is information expressing the type of substrate P provided for the production of the component mounted substrate. The production lot information J13 is information for specifying a production lot for each substrate type. The production count information J14 is information expressing the number of component mounted substrates produced in each production lot. The used component information J15 is information related to the components E used during the production of the component mounted substrate.

Note that the used component information J15 is information associating component identification information J151 for identifying each component E, component type specification information J152 for specifying each component E, the required component count information J153, and the cycle time information J154. The required component count information J153 is set for each component identified by the component identification information J151. Also, the cycle time information J154 is set for each substrate type specified by the substrate type information J12. Described with reference to FIG. 8, the cycle time expressed by the cycle time information J154, "CT1", "CT2", "CT3", "CT4", "CT5", and "CT6" are the same values for each of the components ("PIA1", "PIA2", "PIA3", "PIA4", "PIA5", and "PIA6") identified by the component identification information J151 with respect to one "substrate A" specified by the substrate type information J12. If the substrate is different, the cycle time expressed by the cycle time information J154 sets values corresponding to the different substrate.

The setup management device 6 is a device for managing setup work required for production before the production of the component mounted substrate by the mounters 2. The setup management device 6 contains a microcontroller for example, and outputs setup related information required for managing a setup work plan in the work plan management system 3. The setup management device 6 transmits the setup related information to the work plan management system 3 in accordance with an operation by the worker. The setup related information includes component replenishment work related information and ancillary work related information.

FIG. 9 is a table for explaining component replenishment work related information JH2 that is transmitted from the setup management device 6 and input into the work plan management system 3. The component replenishment work related information JH2 may also be information that includes component remaining count information J22. As described earlier, the component remaining count information J22 is information related to the total number of remaining components E in each AF 241, each tray feeder 245, and each stick feeder 246, and in the present embodiment is transmitted from the mounter operation management device 4.

Specifically, as illustrated in FIG. 9, the component replenishment work related information JH2 is information associating the production order information J11, the substrate type information J12, component supply device information J21, the component identification information J151, the component remaining count information J22, and component remaining count warning value information J23. The component replenishment work related information JH2 is information that is associated with the production plan information JH1 by including the same production order information J11 as the production plan information JH1. The component supply device information J21 is information related to the component supply devices used during the production of a component mounted substrate, and includes device type information J211 expressing the type of component supply device (type of component supply method) and device identification information J212 for identifying each component supply device. The component remaining count warning value information J23 is information indicating that the total number of remaining components expressed by the component remaining count information J22 is a predetermined value (component remaining count warning value) at which a warning is to be issued before there is a shortage of the components E in each AF 241, each tray feeder 245, and each stick feeder 246.

FIG. 10 is a table for explaining ancillary work related information JH3 that is transmitted from the setup management device 6 and input into the work plan management system 3. The ancillary work related information JH3 is information associating the production order information J11, production status information J31, and ancillary work information J32. The ancillary work related information JH3 is information that is associated with the production plan information JH1 and the component replenishment work related information JH2 by including the same production order information J11 as the production plan information JH1 and the component replenishment work related information JH2.

The production status information J31 is information expressing the production status of the production of a component mounted substrate in the production order expressed by the production order information J11. For example, the production status information J31 is information expressing which numbered component mounted substrate has been reached in the production of the production lot expressed by the production lot information J13 for the substrate type expressed by the substrate type information J12 corresponding to the production order expressed by the production order information J11.

The ancillary work information J32 is information related to ancillary work necessary in the production of the component mounted substrate. The ancillary work information J32 includes work type information J321 expressing the type of ancillary work, work identification information J322 for identifying the ancillary work, and work duration information J323 expressing the work duration of the ancillary work expressed by the work type information J321. The work duration of the ancillary work expressed by the work duration information J323 is the time taken from the start until the end of each type of ancillary work, and is found empirically in advance for each type of ancillary work.

The control unit 34 of the work plan management system 3 is provided with components such as a central processing unit (CPU), read-only memory (ROM) that stores a control program, and random access memory (RAM) used as a work area by the CPU. The control unit 34 controls the data communication unit 31, the operation unit 32, and the display unit 33 by having the CPU execute the control program stored in the ROM, and also generates various work plan information related to management for a setup work plan. As illustrated in FIG. 7, the control unit 34 includes a communication control unit 341, an operation control unit 342, a display control unit 343, an acquisition unit 344, a component replenishment management unit 345, and an ancillary work management unit 346.

The communication control unit 341 controls data communication with the mounter operation management device 4, the production plan management device 5, and the setup management device 6 by the data communication unit 31. The operation control unit 342 controls the operation unit 32. The display control unit 343 controls information display operations by the display unit 33.

<Control Operations Related to Setup Work Plan Management in Work Plan Management System>

FIG. 11 will be referenced in addition to FIG. 7 to describe the acquisition unit 344, the component replenishment management unit 345, and the ancillary work management unit 346 in the control unit 34. FIG. 11 is a chart for explaining control operations by the work plan management system 3. FIG. 11 illustrates an example in which a component mounted substrate of a first substrate type is produced in a first production period TW01, and thereafter, the substrate type is switched, and a component mounted substrate of a second substrate type is produced in a second production period TW02. Additionally, FIG. 11 illustrates an example in which, in the first production period TW01, the component mounted substrate is produced by supplying components from three AFs 241A, 241B, and 241C, two tray feeders 245A and 245B, and one stick feeder 246A from among the plurality of component supply devices disposed in parallel in the component supply units 24 of the mounters 2. Furthermore, FIG. 11 illustrates an example in which, to produce the component mounted substrate in the second production period TW02, five types of ancillary work designated first ancillary work, second ancillary work, third ancillary work, fourth ancillary work, and fifth ancillary work are performed during the first production period TW01. Note that the first to fifth ancillary work is the mega reel creation work, the backup pin preparation work, the suction nozzle cleaning work, the tray baking work, and the solder paste mixing work described earlier, for example.

(About Acquisition Unit)

The acquisition unit 344 acquires a management start time TS that expresses a start time of the management for a setup work plan that includes the component replenishment work with respect to each of the AFs 241A, 241B, and 241C, the tray feeders 245A and 245B, and the stick feeder 246A, as well as the first to fifth ancillary work. The acquisition unit 344 may acquire the time of starting the production of the component mounted substrate in the first production period TW01 as the management start time TS, or in the case where command information giving a command to start management is input through the operation unit 32, the acquisition unit 344 may acquire the time when the command information is input as the management start time TS.

(About Component Replenishment Management Unit)

The component replenishment management unit 345 manages a plan for the component replenishment work with respect to each of the AFs 241A, 241B, and 241C, the tray feeders 245A and 245B, and the stick feeder 246A. The component replenishment work includes the component replenishment work of replenishing each of the AFs 241A, 241B, and 241C with new reels, the component replenishment work of replenishing each of the tray feeders 245A and 245B with new pallets, and the component replenishment work of replenishing the stick feeder 246A with new sticks. Note that in the following, the AFs 241A, 241B, and 241C, the tray feeders 245A and 245B, and the stick feeder 246A will be collectively referred to as the "component supply devices 241, 245, and 246", and the reels, pallets, and sticks will be collectively referred to as the "component storage members".

The component replenishment management unit 345 includes a component supply monitoring unit 3451, a replenishment target specifying unit 3452, and a replenishment timing specifying unit 3453. The component supply monitoring unit 3451 monitors the supply status of the components E in each of the component supply devices 241, 245, and 246. The component supply monitoring unit 3451 specifies, for each of the component supply devices 241, 245, and 246, a replenishment possibility time window that expresses a time window in which the component replenishment work is possible. In the example illustrated in FIG. 11, a replenishment possibility time window TWSA is specified for the AF 241A, a replenishment possibility time window TWSB is specified for the AF 241B, and a replenishment possibility time window TWSC is specified for the AF 241C. Also, a replenishment possibility time window TWSD is specified for the tray feeder 245A and a replenishment possibility time window TWSE is specified for the tray feeder 245B. Furthermore, a replenishment possibility time window TWSF is specified for the stick feeder 246A.

The earliest time in each of the replenishment possibility time windows TWSA to TWSF (hereinafter referred to as the "earliest time") is the time at which a preceding component storage member used to supply the components from among the plurality of component storage members loaded into the component supply devices 241, 245, and 246 runs out of components. When the preceding component storage member runs out of components, replenishment with a new component storage member becomes possible. Also, the latest time in each of the replenishment possibility time windows TWSA to TWSF (hereinafter referred to as the "latest time") is the time at which the total number of remaining components in the plurality of component storage members loaded into the component supply devices 241, 245, and 246 reaches a predetermined component remaining count warning value.

The component supply monitoring unit 3451 specifies replenishment possibility time windows TWSA to TWSF for each of the component supply devices 241, 245, and 246 based on information supplied to the control unit 34 from the data communication unit 31, namely the component remaining count information J22 from the mounter operation management device 4 (or the setup management device 6), the production plan information JH1 from the production plan management device 5, and the component replenishment work related information JH2 from the setup management device 6.

Specifically, the component supply monitoring unit 3451 first subtracts the remaining number of components in the succeeding component storage member from the total number of remaining components expressed by the component remaining count information J22, and computes the number of remaining components in the preceding component storage member. Additionally, the component supply monitoring unit 3451 computes the number of components used per second by dividing the required number of each component identified by the component identification information J151 needed to produce a single component mounted substrate, expressed by the required component count information J153, by the component mounting time, specified by the cycle time information J154, of each component during the production of a single component mounted substrate for each substrate specified by the substrate type information J12. Thereafter, the component supply monitoring unit 3451 computes the earliest time in each of the replenishment possibility time windows TWSA to TWSF by dividing the remaining number of components in the preceding component storage member by the number of components used per second. On the other hand, the component supply monitoring unit 3451 computes the latest time in each of the replenishment possibility time windows TWSA to TWSF by subtracting the component remaining count warning value expressed by the component remaining count warning value information J23 from the total number of remaining components expressed by the component remaining count information J22, and dividing the resulting number of components by the number of components used per second.

Incidentally, the total number of remaining components expressed by the component remaining count information J22 is decremented every time a component is picked up by the head unit 25. Although details will be described later, when the preceding component storage member runs out of components and the component supply devices 241, 245, and 246 are replenished with a new component storage member, the total number of remaining components is updated by adding the number of components stored in the new component storage member (initial set number) to the total number of remaining components that changes every time a component is picked up by the head unit 25. The number of components stored in the component storage member (initial set number) is stored for each component identified by the component identification information J151 in a location such as the ROM of the control unit 34. Note that in the case where a partially used component storage member is used for replenishment as the new component storage member, the initial set number stored in the ROM or the like of the control unit 34 is overwritten by the actual number of components stored in the component storage member.

Next, the replenishment target specifying unit 3452 specifies a component replenishment target device targeted for component replenishment among the component supply devices 241, 245, and 246. Specifically, first, the replenishment target specifying unit 3452 recognizes an overlapping replenishment time window in which the replenishment possibility time windows TWSA to TWSF overlap each other. In the example illustrated in FIG. 11, the replenishment target specifying unit 3452 recognizes a plurality of overlapping replenishment time windows, namely a first overlapping replenishment time window TWD1, a second overlapping replenishment time window TWD2, and a third overlapping replenishment time window TWD3 in order of earliest time. The first overlapping replenishment time window TWD1 is a time window in which the replenishment possibility time window TWSA of the AF 241A and the replenishment possibility time window TWSB of the AF 241B overlap. The earliest time of the first overlapping replenishment time window TWD1 matches an earliest time T1 in the replenishment possibility time window TWSB of the AF 241B, and the latest time of the first overlapping replenishment time window TWD1 matches a latest time T2 in the replenishment possibility time window TWSA of the AF 241A.

The second overlapping replenishment time window TWD2 is a time window in which the replenishment possibility time window TWSC of the AF 241C and the replenishment possibility time window TWSD of the tray feeder 245A overlap. The earliest time of the second overlapping replenishment time window TWD2 matches an earliest time T3 in the replenishment possibility time window TWSC of the AF 241C, and the latest time of the second overlapping replenishment time window TWD2 matches a latest time T4 in the replenishment possibility time window TWSD of the tray feeder 245A. The third overlapping replenishment time window TWD3 is a time window in which the replenishment possibility time window TWSE of the tray feeder 245B and the replenishment possibility time window TWSF of the stick feeder 246A overlap. The earliest time of the third overlapping replenishment time window TWD3 matches an earliest time T5 in the replenishment possibility time window TWSF of the stick feeder 246A, and the latest time of the third overlapping replenishment time window TWD3 matches a latest time T6 in the replenishment possibility time window TWSE of the tray feeder 245B.

Additionally, the replenishment target specifying unit 3452 specifies all component supply devices for which the component replenishment work is possible within each of the overlapping replenishment time windows TWD1, TWD2, and TWD3 as component replenishment target devices. The replenishment target specifying unit 3452 specifies the component replenishment target devices for each of the first to third overlapping replenishment time windows TWD1, TWD2, and TWD3. In the example illustrated in FIG. 11, the replenishment target specifying unit 3452 specifies the AFs 241A and 241B as the component replenishment target devices for which the component replenishment work is possible within the first overlapping replenishment time window TWD1. Also, the replenishment target specifying unit 3452 specifies the AF 241C and the tray feeder 245A as the component replenishment target devices for which the component replenishment work is possible within the second overlapping replenishment time window TWD2. Also, the replenishment target specifying unit 3452 specifies the tray feeder 245B and the stick feeder 246A as the component replenishment target devices for which the component replenishment work is possible within the third overlapping replenishment time window TWD3.

In this way, the replenishment target specifying unit 3452 specifies all component supply devices for which the component replenishment work is possible within each of the overlapping replenishment time windows TWD1, TWD2, and TWD3 as component replenishment target devices. With this arrangement, "batch replenishment" becomes possible in which the component replenishment work is performed all at once by a worker for the component supply devices 241, 245, and 246 that can be replenished with the component storage members within each of the overlapping replenishment time windows TWD1, TWD2, and TWD3. With this reason, the frequency at which the worker goes to the mounters 2 where the component supply devices 241, 245, and 246 are installed can be reduced, and the burden of component replenishment work imposed on the worker can be reduced.

Next, the replenishment timing specifying unit 3453 specifies, for each of the first to third overlapping replenishment time windows TWD1, TWD2, and TWD3, the same replenishment work timing of the component replenishment work with respect to the component supply devices 241, 245, and 246 specified as the component replenishment target devices by the replenishment target specifying unit 3452. In the example illustrated in FIG. 11, the replenishment timing specifying unit 3453 specifies the same first replenishment work timing TH1 as the timing of the component replenishment work within the first overlapping replenishment time window TWD1 with respect to the AFs 241A and 241B. Also, the replenishment timing specifying unit 3453 specifies the same second replenishment work timing TH2 as the timing of the component replenishment work within the second overlapping replenishment time window TWD2 with respect to the AF 241C and the tray feeder 245A. Also, the replenishment timing specifying unit 3453 specifies the same third replenishment work timing TH3 as the timing of the component replenishment work within the third overlapping replenishment time window TWD3 with respect to the tray feeder 245B and the stick feeder 246A. Details about the operation of specifying each of the replenishment work timings TH1, TH2, and TH3 by the replenishment timing specifying unit 3453 will be described later.

(About Ancillary Work Management Unit)

The ancillary work management unit 346 manages a plan for each of the first to fifth ancillary work. The ancillary work management unit 346 includes a work duration specifying unit 3461, a work start target specifying unit 3462, and an ancillary work timing specifying unit 3463.

The work duration specifying unit 3461 specifies a recommended work start time window for each of the first to fifth ancillary work based on the work duration from the start until the end of the work expressed by the work duration information J323 of the ancillary work related information JH3. In the first to fifth ancillary work, the recommended work start time window is a time window in which the start of work is recommended. In the example illustrated in FIG. 11, a recommended work start time window TWC1 is specified for the first ancillary work, a recommended work start time window TWC2 is specified for the second ancillary work, a recommended work start time window TWC3 is specified for the third ancillary work, a recommended work start time window TWC4 is specified for the fourth ancillary work, and a recommended work start time window TWC5 is specified for the fifth ancillary work. The time interval of the recommended work start time windows TWC1 to TWC5 for each of the first to fifth ancillary work is set to a fixed, predetermined length of time (for example, 30 minutes). In other words, the time after a predetermined length of time elapses from the earliest time of the recommended work start time windows TWC1 to TWC5 is the latest time of the recommended work start time windows TWC1 to TWC5.

Also, the work duration specifying unit 3461 specifies, for each of the first to fifth ancillary work, an estimated work end time TCEA at which the work is estimated to end in the case where each type of ancillary work is started from the latest time of the recommended work start time windows TWC1 to TWC5. The estimated work end time TCEA for each of the first to fifth ancillary work is the time at which the work duration (the length of time expressed by the work duration information J323) has elapsed from the latest time of each of the recommended work start time windows TWC1 to TWC5. In the example illustrated in FIG. 11, for the first ancillary work, the time at which the work duration WT1 has elapsed from the latest time of the recommended work start time window TWC1 is specified as the estimated work end time TCEA. Also, for the second ancillary work, the time at which the work duration WT2 has elapsed from the latest time of the recommended work start time window TWC2 is specified as the estimated work end time TCEA. Also, for the third ancillary work, the time at which the work duration WT3 has elapsed from the latest time of the recommended work start time window TWC3 is specified as the estimated work end time TCEA. Also, for the fourth ancillary work, the time at which the work duration WT4 has elapsed from the latest time of the recommended work start time window TWC4 is specified as the estimated work end time TCEA. Also, for the fifth ancillary work, the time at which the work duration WT5 has elapsed from the latest time of the recommended work start time window TWC5 is specified as the estimated work end time TCEA.

The estimated work end time TCEA of the first to fifth ancillary work is set to match a substrate type switch timing TP in the production of the component mounted substrate. In other words, the latest times of the recommended work start time windows TWC1 to TWC5 for each of the first to fifth ancillary work are set such that the estimated work end time TCEA matches the substrate type switch timing TP. The substrate type switch timing TP is a timing that demarcates the first production period TW01 and the second production period TW02. Note that in the example illustrated in FIG. 11, the estimated work end time TCEA of each of the first to fifth ancillary work matches the substrate type switch timing TP, but ancillary work whose estimated work end time does not match the switch timing TP may also exist. For example, if same type of ancillary work exists but the production line is different, there is a possibility of ancillary work whose estimated work end time does not match the switch timing TP. In addition, ancillary work that has little relation to the switching of the substrate type may also exist.

For the first to fifth ancillary work, the work start target specifying unit 3462 specifies all of the ancillary work for which the earliest time of each of the overlapping replenishment time windows TWD1 to TWD3 is included in the recommended work start time windows TWC1 to TWC5 as start target work to be started within each of the overlapping replenishment time windows TWD1 to TWD3. The work start target specifying unit 3462 specifies each start target work in association with one of the overlapping replenishment time windows TWD1 to TWD3. In the example illustrated in FIG. 11, the work start target specifying unit 3462 specifies the third to fifth ancillary work set with the recommended work start time windows TWC3, TWC4, and TWC5 containing the earliest time of the first overlapping replenishment time window TWD1 as the start target work to be started within the first overlapping replenishment time window TWD1. Also, the work start target specifying unit 3462 specifies the first and second ancillary work set with the recommended work start time windows TWC1 and TWC2 containing the earliest time of the second overlapping replenishment time window TWD2 as the start target work to be started within the second overlapping replenishment time window TWD2. Note that ancillary work set with a recommended work start time window containing the earliest time of the third overlapping replenishment time window TWD3 does not exist. In this case, the work start target specifying unit 3462 does not specify start target work to be started within the third overlapping replenishment time window TWD3.

In this way, the work start target specifying unit 3462 specifies, as the start target work, all of the ancillary work for which the earliest time of each of the overlapping replenishment time windows TWD1 to TWD3 is included in the recommended work start time windows TWC1 to TWC5 specified for each of the first to fifth ancillary work. The start target work is ancillary work to be started within each of the overlapping replenishment time windows TWD1 to TWD3. In other words, the ancillary work specified as the start target work can be started within each of the overlapping replenishment time windows TWD1 to TWD3 in the same time windows as the "batch replenishment" of the component replenishment work. Consequently, the burden imposed on the work by the setup work, which includes ancillary work in addition to component replenishment work, can be reduced.

Next, the ancillary work timing specifying unit 3463 specifies, for each of the first to third overlapping replenishment time windows TWD1 to TWD3, the same work start timing for the ancillary work specified as the start target work by the work start target specifying unit 3462. The ancillary work timing specifying unit 3463 specifies the replenishment work timing specified for each of the first to third overlapping replenishment time windows TWD1 to TWD3 by the replenishment timing specifying unit 3453 as the work start timing. In the example illustrated in FIG. 11, for the third to fifth ancillary work specified as the start target work within the first overlapping replenishment time window TWD1, the same timing as the first replenishment work timing TH1 is specified as a first work start timing TS1. Also, for the first and second ancillary work specified as the start target work within the second overlapping replenishment time window TWD2, the same timing as the second replenishment work timing TH2 is specified as a second work start timing TS2. With this arrangement, in the first overlapping replenishment time window TWD1, a worker is able to perform the component replenishment work with respect to the AFs 241A and 241B as well as the third to fifth ancillary work together at the same timing. In addition, in the second overlapping replenishment time window TWD2, the worker is able to perform the component replenishment work with respect to the AF 241C and the tray feeder 245A as well as the first and second ancillary work together at the same timing.

Also, the work duration specifying unit 3461 specifies a work end time in addition to the specification of the recommended work start time windows TWC1 to TWC5 and the estimated work end time TCEA in association with each of the first to fifth ancillary work. The work end time is a time at which work ends in the case where the ancillary work is started at the same work start timings TS1 and TS2 as the replenishment work timings TH1 and TH2. In other words, the work end times are the times at which the work duration (the length of time expressed by the work duration information J323) has elapsed from the work start timings TS1 and TS2. In the example illustrated in FIG. 11, for the first ancillary work, the time at which the work duration WT1 has elapsed from the same second work start timing TS2 as the second replenishment work timing TH2 is specified as a work end time TCE1. Also, for the second ancillary work, the time at which the work duration WT2 has elapsed from the same second work start timing TS2 as the second replenishment work timing TH2 is specified as a work end time TCE2. Also, for the third ancillary work, the time at which the work duration WT3 has elapsed from the same first work start timing TS1 as the first replenishment work timing TH1 is specified as a work end time TCE3. Also, for the fourth ancillary work, the time at which the work duration WT4 has elapsed from the same first work start timing TS1 as the first replenishment work timing TH1 is specified as a work end time TCE4. Also, for the fifth ancillary work, the time at which the work duration WT5 has elapsed from the same first work start timing TS1 as the first replenishment work timing TH1 is specified as a work end time TCE5.

Note that, as described earlier, the latest times of the recommended work start time windows TWC1 to TWC5 for each of the first to fifth ancillary work are set such that the estimated work end time TCEA matches the substrate type switch timing TP. With this arrangement, a worker is able to finish the work of the first to fifth ancillary work on or before the substrate type switch timing TP.

<Advanced Settings for Component Replenishment Timing and Work Start Timing>

As described earlier, the replenishment work timings TH1, TH2, and TH3 of the component replenishment work with respect to the component supply devices 241, 245, and 246 are specified by the replenishment timing specifying unit 3453. Also, the work start timings TS1 and TS2 of the first to fifth ancillary work are specified by the ancillary work timing specifying unit 3463. Note that in the example illustrated in FIG. 11, the first work start timing TS1 of the first and second ancillary work is set to the same timing as the second replenishment work timing TH2 with respect to the AF 241C and the tray feeder 245A within the second overlapping replenishment time window TWD2. Also, the second work start timing TS2 of the third to fifth ancillary work is set to the same timing as the first replenishment work timing TH1 with respect to the AFs 241A and 241B within the first overlapping replenishment time window TWD1.

In the case where a first overlapping time window of interest containing the latest times of the recommended work start time windows TWC1 to TWC5 exists among the first to third overlapping replenishment time windows TWD1 to TWD3, the replenishment timing specifying unit 3453 specifies a predetermined time earlier than the latest time within the first overlapping time window of interest as the replenishment work timing. In the example illustrated in FIG. 11, the latest time T2 of the first overlapping replenishment time window TWD1 is a time later than the latest time of the recommended work start time window TWC5 of the fifth ancillary work. In other words, the first overlapping replenishment time window TWD1 is the first overlapping time window of interest containing the latest time of the recommended work start time window TWC5 of the fifth ancillary work. Note that the latest time of the recommended work start time window TWC5 of the third ancillary work and the latest time of the recommended work start time window TWC4 of the fourth ancillary work are times later than the latest time T2 of the first overlapping replenishment time window TWD1, and are not included in the first overlapping replenishment time window TWD1.

The replenishment timing specifying unit 3453 specifies a time earlier than the latest time of the recommended work start time window TWC5 of the fifth ancillary work as the first replenishment work timing TH1 with respect to the AFs 241A and 241B treated as the component replenishment target devices within the first overlapping time window of interest, namely the first overlapping replenishment time window TWD1. Additionally, the ancillary work timing specifying unit 3463 specifies the same timing as the first replenishment work timing TH1 as the first work start timing TS1 with respect to the third to fifth ancillary work treated as the start target work within the first overlapping replenishment time window TWD1. With this arrangement, in the first overlapping replenishment time window TWD1 treated as the first overlapping time window of interest, a worker is able to perform the component replenishment work with respect to the AFs 241A and 241B as well as the third to fifth ancillary work at the same timing treated as the first replenishment work timing TH1.

Also, it is desirable for the replenishment timing specifying unit 3453 to specify the earliest time T1 of the first overlapping replenishment time window TWD1 as the first replenishment work timing TH1 within the first overlapping replenishment time window TWD1. The earliest time T1 of the first overlapping replenishment time window TWD1 is the earliest time within the first overlapping replenishment time window TWD1. By treating such an earliest time T1 within the first overlapping replenishment time window TWD1 as the first replenishment work timing TH1, a worker is able to perform the component replenishment work with respect to the AFs 241A and 241B as well as the third to fifth ancillary work together at the same timing, with time to spare.

Similarly, it is desirable for the replenishment timing specifying unit 3453 to specify the earliest time T3 of the second overlapping replenishment time window TWD2 as the second replenishment work timing TH2 within the second overlapping replenishment time window TWD2. The earliest time T3 of the second overlapping replenishment time window TWD2 is the earliest time within the second overlapping replenishment time window TWD2. By treating such an earliest time T3 within the second overlapping replenishment time window TWD2 as the second replenishment work timing TH2, a worker is able to perform the component replenishment work with respect to the AF 241C and the tray feeder 245A as well as the first and second ancillary work together at the same timing, with time to spare.

Furthermore, in the case where a second overlapping time window of interest later than the latest times of the recommended work start time windows TWC1 to TWC5 of each of the first to fifth ancillary work and also containing one of the work end times TCE1 to TCE5 exists among the first to third overlapping replenishment time windows TWD1 to TWD3, the replenishment timing specifying unit 3453 specifies the work end time within the second overlapping time window of interest as the replenishment work timing. In the example illustrated in FIG. 11, the third overlapping replenishment time window TWD3 is a time window later than the latest times of the recommended work start time windows TWC1 to TWC5 of each of the first to fifth ancillary work. Furthermore, the third overlapping replenishment time window TWD3 contains the work end time TCE5 of the fifth ancillary work. In other words, the third overlapping replenishment time window TWD3 is the second overlapping time window of interest.

The replenishment timing specifying unit 3453 specifies the work end time TCE5 of the fifth ancillary work as the third replenishment work timing TH3 with respect to the tray feeder 245B and the stick feeder 246A treated as the component replenishment target devices within the second overlapping time window of interest, namely the third overlapping replenishment time window TWD3. At the work end time TCE5 of the fifth ancillary work, there is a possibility that a worker will go to the mounters 2 to cause the product at the end of the fifth ancillary work to be reflected in the production of the component mounted substrate at the mounters 2. In such a third overlapping replenishment time window TWD3 treated as the second overlapping time window of interest containing the work end time TCE5, the third replenishment work timing TH3 is set to the work end time TCE5. With this arrangement, the worker is able to perform the component replenishment work with respect to the tray feeder 245B and the stick feeder 246A at the timing of going to the mounters 2 in association with the end of the fifth ancillary work.

In addition, in the case where a third overlapping time window of interest later than the latest times of the recommended work start time windows TWC1 to TWC5 of each of the first to fifth ancillary work and also containing the estimated work end time TCEA exists among the first to third overlapping replenishment time windows TWD1 to TWD3, the replenishment timing specifying unit 3453 specifies the estimated work end time TCEA within the third overlapping time window of interest as the replenishment work timing. In the example illustrated in FIG. 11, the third overlapping replenishment time window TWD3 is a time window later than the latest times of the recommended work start time windows TWC1 to TWC5 of each of the first to fifth ancillary work. Furthermore, the third overlapping replenishment time window TWD3 contains the estimated work end time TCEA of the first to fifth ancillary works. In other words, the third overlapping replenishment time window TWD3 is the third overlapping time window of interest.

The replenishment timing specifying unit 3453 may be configured to specify the estimated work end time TCEA of the first to fifth ancillary works as the third replenishment work timing TH3 with respect to the tray feeder 245B and the stick feeder 246A treated as the component replenishment target devices within the third overlapping time window of interest, namely the third overlapping replenishment time window TWD3. At the estimated work end time TCEA of the ancillary work, there is a possibility that a worker will go to the mounters 2 to perform work related to the ancillary work. For example, in the case where the estimated work end time TCEA of the first to fifth ancillary work matches the substrate type switch timing TP, there is a possibility that a worker will go to the mounters 2 to perform work for switching the substrate type. In such a third overlapping replenishment time window TWD3 treated as the third overlapping time window of interest containing the estimated work end time TCEA, the third replenishment work timing TH3 is set to the estimated work end time TCEA. With this arrangement, the worker is able to perform the component replenishment work with respect to the tray feeder 245B and the stick feeder 246A at the timing of going to the mounters 2 in association with the switching the substrate type and the like.

The component replenishment management unit 345 and the ancillary work management unit 346 above generate work plan information expressing various specification results related to a plan for setup work. The work plan information generated by the component replenishment management unit 345 and the ancillary work management unit 346 mainly includes the specification results of the component supply devices 241, 245, and 246 treated as the targets of the component replenishment work by the replenishment target specifying unit 3452, and the specification results of the ancillary work treated as the work start targets by the work start target specifying unit 3462. Note that information related to the replenishment work timings TH1, TH2, and TH3 specified by the replenishment timing specifying unit 3453 and information related to the work start timings TS1 and TS2 specified by the ancillary work timing specifying unit 3463 may also be added to the work plan information. FIG. 12 is a diagram for explaining work plan information JH4 generated by the component replenishment management unit 345 and the ancillary work management unit 346.

The work plan information JH4 is information that includes replenishment work plan information J41 and ancillary work plan information J42. The replenishment work plan information J41 is information associating replenishment work timing information J411, the component supply device information J21, the component identification information J151, and the component type specification information J152. The replenishment work timing information J411 is information expressing the specification results of the replenishment work timings TH1, TH2, and TH3 by the replenishment timing specifying unit 3453. The ancillary work plan information J42 is information associating ancillary work timing information J421 and the ancillary work information J32. The ancillary work timing information J421 is information expressing the specification results of the work start timing TS1 and TS2 by the ancillary work timing specifying unit 3463.

The work plan information JH4 is displayed on the display unit 33 controlled by the display control unit 343. The work plan information JH4 is also supplied to the data communication unit 31 and transmitted to the mounter operation management device 4 from the data communication unit 31 controlled by the communication control unit 341. Based on the work plan information JH4 input into the mounter operation management device 4, a worker on the production line is able to perform the component replenishment work with respect to the component supply devices 241, 245, and 246 as well as the third to fifth ancillary work together at the same timing.

The above describes a work plan management system and a component mounting system according to an embodiment of the present disclosure, but the present disclosure is not limited thereto, and may adopt a modified embodiment like the following, for example.

FIG. 13 is a chart for explaining a modification of control operations by the work plan management system 3. In the control operations by the work plan management system 3 illustrated in FIG. 13, the specifying operations when the replenishment target specifying unit 3452 specifies the component supply devices 241, 245, and 246 to target for component replenishment work are different from the specifying operations described earlier (see FIG. 11).

In an example shown in FIG. 13, the replenishment target specifying unit 3452 divides the first production period TW01 into a plurality of specified periods TW11, TW12, and TW13, treating a predetermined specified length of time as a time interval. The specified length of time that prescribes the time interval of each of the specified periods TW11, TW12, and TW13 is input by a worker through the operation unit 32, and is set to any length of time, such as 30 minutes for example. In the following, the specified periods will be referred to as the first specified period TW11, the second specified period TW12, and the third specified period TW13 in time-series order from earliest to latest. A fixed time interval for each of the first to third specified periods TW11, TW12, and TW13 are set.

Additionally, the replenishment target specifying unit 3452 recognizes the first to third overlapping replenishment time windows TWD1 to TWD3 that overlap with the replenishment possibility time windows TWSA to TWSF corresponding to each of the component supply devices 241, 245, and 246. Furthermore, the replenishment target specifying unit 3452 determines whether or not the earliest time of any of the first to third overlapping replenishment time windows TWD1 to TWD3 is included in each of the first to third specified periods TW11, TW12, and TW13. In the example illustrated in FIG. 13, the earliest time of the first overlapping replenishment time window TWD1 is included in the first specified period TW11, the earliest time of the second overlapping replenishment time window TWD2 is included in the second specified period TW12, and the earliest time of the third overlapping replenishment time window TWD3 is included in the third specified period TW13.

In this case, within the first overlapping replenishment time window TWD1, the replenishment target specifying unit 3452 specifies the AFs 241A and 241B as the component replenishment target devices for which component replenishment work is possible in the time window between the earliest time of the first overlapping replenishment time window TWD1 and the latest time of the first specified period TW11. Also, within the second overlapping replenishment time window TWD2, the replenishment target specifying unit 3452 specifies the AF 241C and the tray feeder 245A as the component replenishment target devices for which component replenishment work is possible in the time window between the earliest time of the second overlapping replenishment time window TWD2 and the latest time of the second specified period TW12. Also, within the third overlapping replenishment time window TWD3, the replenishment target specifying unit 3452 specifies the tray feeder 245B and the stick feeder 246A as the component replenishment target devices for which component replenishment work is possible in the time window between the earliest time of the third overlapping replenishment time window TWD3 and the latest time of the third specified period TW13.

Within the first overlapping replenishment time window TWD1, the replenishment timing specifying unit 3453 specifies the same first replenishment work timing TH1 with respect to the AFs 241A and 241B within the time window between the earliest time of the first overlapping replenishment time window TWD1 and the latest time of the first specified period TW11. Also, within the second overlapping replenishment time window TWD2, the replenishment timing specifying unit 3453 specifies the same second replenishment work timing TH2 with respect to the AF 241C and the tray feeder 245A within the time window between the earliest time of the second overlapping replenishment time window TWD2 and the latest time of the second specified period TW12. Also, within the third overlapping replenishment time window TWD3, the replenishment timing specifying unit 3453 specifies the same third replenishment work timing TH3 with respect to the tray feeder 245B and the stick feeder 246A within the time window between the earliest time of the third overlapping replenishment time window TWD3 and the latest time of the third specified period TW13.

Next, the work start target specifying unit 3462, as described above, specifies the third to fifth ancillary work set with the recommended work start time windows TWC3, TWC4, and TWC5 containing the earliest time of the first overlapping replenishment time window TWD1 as the start target work to be started within the first overlapping replenishment time window TWD1. Also, the work start target specifying unit 3462 specifies the first and second ancillary work set with the recommended work start time windows TWC1 and TWC2 containing the earliest time of the second overlapping replenishment time window TWD2 as the start target work to be started within the second overlapping replenishment time window TWD2. Note that ancillary work set with a recommended work start time window containing the earliest time of the third overlapping replenishment time window TWD3 does not exist. In this case, the work start target specifying unit 3462 does not specify start target work to be started within the third overlapping replenishment time window TWD3.

The ancillary work specified by the work start target specifying unit 3462 as the start target work can be started in the same time windows as the "batch replenishment" of the component replenishment work. Consequently, the burden imposed on the work by the setup work, which includes ancillary work in addition to component replenishment work, can be reduced.

The ancillary work timing specifying unit 3463 specifies, for the third to fifth ancillary work specified as the start target work within the first overlapping replenishment time window TWD1, the same timing as the first replenishment work timing TH1 as a first work start timing TS1. Also, the ancillary work timing specifying unit 3463 specifies, for the third to fifth ancillary work specified as the start target work within the second overlapping replenishment time window TWD2, the same timing as the second replenishment work timing TH2 as a second work start timing TS2. With this arrangement, in the first overlapping replenishment time window TWD1, a worker is able to perform the component replenishment work with respect to the AFs 241A and 241B as well as the third to fifth ancillary work together at the same timing. In addition, in the second overlapping replenishment time window TWD2, the worker is able to perform the component replenishment work with respect to the AF 241C and the tray feeder 245A as well as the first and second ancillary work together at the same timing.

The specific embodiments described above mainly include embodiments having the following configurations.

A work plan management system according to an aspect of the present disclosure is a system that manages a plan for setup work for producing a component mounted substrate with respect to a mounter that produces the component mounted substrate by mounting, onto a substrate, components supplied from a plurality of attached component supply devices into which a plurality of component storage members are loadable. This work plan management system includes a component replenishment management unit that manages a plan for component replenishment work, the component replenishment work being setup work that replenishes each of the plurality of component supply devices with a new component storage member, and an ancillary work management unit that manages a plan for a plurality of ancillary work performed during the production of the component mounted substrate, the ancillary work being setup work other than the component replenishment work. The component replenishment management unit includes a component supply monitoring unit that monitors a supply status of the components in each of the plurality of component supply devices, and specifies, for each of the plurality of component supply devices, a replenishment possibility time window expressing a time window during which the component replenishment work is possible, and a replenishment target specifying unit that recognizes an overlapping replenishment time window in which the replenishment possibility time windows overlap each other, and specifies a component supply device for which the component replenishment work is possible within the overlapping replenishment time window as a component replenishment target device treated as a target of the component replenishment work. The ancillary work management unit includes a work duration specifying unit that specifies, for each of the plurality of ancillary work, a recommended work start time window expressing a time window in which the start of work is recommended, based on a work duration from a start until an end of each of the plurality of ancillary work, and a work start target specifying unit that specifies, from among the plurality of ancillary work, ancillary work for which an earliest time of the overlapping replenishment time window is included in the recommended work start time window as start target work to be started within the overlapping replenishment time window.

According to this work plan management system, in the setup work performed when producing a component mounted substrate with a mounter, the plan for component replenishment work for the component supply devices is managed by the component replenishment management unit, and the plan for the ancillary work is managed by the ancillary work management unit. The replenishment target specifying unit of the component replenishment management unit recognizes the overlapping replenishment time windows overlapped in the replenishment possibility time windows specified for each of the plurality of component supply devices, and specifies component supply devices for which the component replenishment work is possible within the overlapping replenishment time windows as component replenishment target devices. With this arrangement, "batch replenishment" becomes possible in which the component replenishment work is performed all at once by a worker for the component supply devices that can be replenished with the component storage members within the overlapping replenishment time windows. With this reason, the frequency at which the worker goes to the mounters where the component supply devices are installed can be reduced, and the burden of component replenishment work imposed on the worker can be reduced.

In addition, the work start target specifying unit of the ancillary work management unit specifies, as the start target work, the ancillary work for which the earliest time of the overlapping replenishment time windows is included in the recommended work start time windows specified for each of the plurality of ancillary work. The start target work is ancillary work to be started within the overlapping replenishment time windows. In other words, the ancillary work specified as the start target work can be started within the overlapping replenishment time windows in the same time windows as the "batch replenishment" of the component replenishment work. Consequently, the burden imposed on the work by the setup work, which includes ancillary work in addition to component replenishment work, can be reduced.

In the work plan management system described above, in a case where a plurality of overlapping replenishment time windows exist, the replenishment target specifying unit may be configured to specify the component replenishment target device for each of the overlapping replenishment time windows, and the work start target specifying unit may be configured to specify the start target work in association with one of the plurality of overlapping replenishment time windows.

In this aspect, a worker is able to perform the component replenishment work with respect to each component replenishment target device and the ancillary work of each start target work together in each of the plurality of overlapping replenishment time windows.

In the work plan management system described above, the component replenishment management unit may additionally include a replenishment timing specifying unit that specifies a same replenishment work timing of the component replenishment work with respect to the component replenishment target device in the overlapping replenishment time window, and the ancillary work management unit may additionally include an ancillary work timing specifying unit that specifies the replenishment work timing as work start timing of the start target work.

In this aspect, the replenishment work timing of the component replenishment work with respect to the component replenishment target devices specified by the replenishment target specifying unit is set to the same timing in the overlapping replenishment time window. Furthermore, the work start timing of the start target work specified by the work start target specifying unit is set to the same timing as the replenishment work timing. With this arrangement, a worker is able to perform the component replenishment work with respect to each component replenishment target device and the ancillary work of each start target work at the same timing in the overlapping replenishment time window.

In the work plan management system described above, in a case where the overlapping replenishment time window is a first overlapping time window of interest containing a latest time of the recommended work start time window, the replenishment timing specifying unit may be configured to specify a predetermined time earlier than the latest time within the first overlapping time window of interest as the replenishment work timing.

The work start timing of the ancillary work is set to the same timing as the replenishment work timing within the overlapping replenishment time window. Here, in the first overlapping time window of interest containing the latest time of the recommended work start time window, the replenishment work timing is set to a time earlier than the latest time of the recommended work start time window. With this arrangement, a worker is able to perform the component replenishment work with respect to each component replenishment target device and the ancillary work of each start target work at the same timing treated as the replenishment work timing in the first overlapping time window of interest.

In the work plan management system described above, the work duration specifying unit may be configured to specify, for each of the plurality of ancillary work, a work end time in a case where the ancillary work is started at the work start timing, and in a case where the overlapping replenishment time window is a second overlapping time window of interest that is later than a latest time of the recommended work start time window of each of the plurality of ancillary work and also contains the work end time, the replenishment timing specifying unit may be configured to specify the work end time within the second overlapping time window of interest as the replenishment work timing.

At the work end time of the ancillary work, there is a possibility that a worker will go to the mounters to cause the product at the end of the work to be reflected in the production of the component mounted substrate at the mounters. In such a second overlapping time window of interest containing the work end time, the replenishment work timing is set to the work end time. With this arrangement, the worker is able to perform the component replenishment work with respect to each component replenishment target device at the timing of going to the mounters in association with the end of the ancillary work.

In the work plan management system described above, the work duration specifying unit may be configured to specify, for each of the plurality of ancillary work, an estimated work end time at which the ancillary work is estimated to end in a case where the ancillary work is started at the latest time of the recommended work start time window, and in a case where the overlapping replenishment time window is a third overlapping time window of interest that is later than a latest time of the recommended work start time window of each of the plurality of ancillary work and also contains the estimated work end time, the replenishment timing specifying unit may be configured to specify the estimated work end time within the third overlapping time window of interest as the replenishment work timing.

Further, in the work plan management system described above, the latest time of the recommended work start time window may be set such that the estimated work end time matches a substrate type switch timing in the production of the component mounted substrate.

At the estimated work end time of the ancillary work, there is a possibility that a worker will go to the mounters to perform work related to the ancillary work. For example, in the case where the estimated work end time of the ancillary work matches the substrate type switch timing, there is a possibility that a worker will go to the mounters to perform work for switching the substrate type. In such a third overlapping time window of interest containing the estimated work end time, the replenishment work timing is set to the estimated work end time. With this arrangement, the worker is able to perform the component replenishment work with respect to each component replenishment target device at the timing of going to the mounters in association with work such as switching the substrate type.

A component mounting system according to another aspect of the present disclosure includes a mounter that produces a component mounted substrate by mounting, onto a substrate, components supplied from a plurality of attached component supply devices into which a plurality of component storage members are loadable, and the work plan management system that manages a plan for setup work for producing the component mounted substrate with respect to the mounter.

The component mounting system is provided with a work plan management system capable of reducing the burden of setup work on the worker. Consequently, a drop in the production efficiency of the component mounted substrate caused by a delay in the setup work by the worker can be suppressed.

As described above, according to the present disclosure, it is possible to provide a work plan management system capable of reducing the burden of setup work on the worker when producing a component mounted substrate with a mounter, as well as a component mounting system provided with the same.

What is claimed is:
1. A system comprising:
a work plan management system that manages a plan for setup work for producing a component mounted substrate, the work plan management system comprising a processor configured to:
  manage a plan for component replenishment work, the component replenishment work being setup work that replenishes each of the plurality of component supply devices with a new component storage member; and
  manage a plan for a plurality of ancillary work performed during the production of the component mounted substrate, the ancillary work being setup work other than the component replenishment work, wherein
in order to manage the plan for component replenishment work, the processor is configured to:

monitor a supply status of the components in each of the plurality of component supply devices, and specify, for each of the plurality of component supply devices, a replenishment possibility time window expressing a time window during which the component replenishment work is possible, and recognize an overlapping replenishment time window in which the replenishment possibility time windows overlap each other, and specify a component supply device for which the component replenishment work is possible within the overlapping replenishment time window as a component replenishment target device treated as a target of the component replenishment work, and in order to manage the plan for the plurality of ancillary work, the processor is further configured to:

specify, for each of the plurality of ancillary work, a recommended work start time window expressing a time window in which the start of work is recommended, based on a work duration from a start until an end of each of the plurality of ancillary work, and specify, from among the plurality of ancillary work, ancillary work for which an earliest time of the overlapping replenishment time window is included in the recommended work start time window as start target work to be started within the overlapping replenishment time window; and a mounter operation management device, the mounter operation management device being configured to control a mounter according to the plan for setup work for producing the component mounted substrate by mounting, onto a substrate, components supplied from a plurality of attached component supply devices into which a plurality of component storage members are loadable.

2. The system according to claim 1, wherein
in a case where a plurality of overlapping replenishment time windows exist, the processor is configured to specify the component replenishment target device for each of the overlapping replenishment time windows, and
the processor is configured to specify the start target work in association with one of the plurality of overlapping replenishment time windows.

3. The system according to claim 1, wherein
the processor is further configured to specify a same replenishment work timing of the component replenishment work with respect to the component replenishment target device in the overlapping replenishment time window, and
the processor is further configured to specify the replenishment work timing as work start timing of the start target work.

4. The system according to claim 3, wherein in a case where the overlapping replenishment time window is a first overlapping time window of interest containing a latest time of the recommended work start time window, the processor is configured to specify a predetermined time earlier than the latest time within the first overlapping time window of interest as the replenishment work timing.

5. The system according to claim 3, wherein
the processor is configured to specify, for each of the plurality of ancillary work, a work end time in a case where the ancillary work is started at the work start timing, and in a case where the overlapping replenishment time window is a second overlapping time window of interest that is later than a latest time of the recommended work start time window of each of the plurality of ancillary work and also contains the work end time, the processor is configured to specify the work end time within the second overlapping time window of interest as the replenishment work timing.

6. The system according to claim 3, wherein
the processor is configured to specify, for each of the plurality of ancillary work, an estimated work end time at which the ancillary work is estimated to end in a case where the ancillary work is started at the latest time of the recommended work start time window, and in a case where the overlapping replenishment time window is a third overlapping time window of interest that is later than a latest time of the recommended work start time window of each of the plurality of ancillary work and also contains the estimated work end time, the processor is configured to specify the estimated work end time within the third overlapping time window of interest as the replenishment work timing.

7. The system according to claim 6, wherein the latest time of the recommended work start time window is set such that the estimated work end time matches a substrate type switch timing in the production of the component mounted substrate.

8. The system according to claim 2, wherein
the processor is configured to specify a same replenishment work timing of the component replenishment work with respect to the component replenishment target device in the overlapping replenishment time window, and
the processor is configured to specify the replenishment work timing as work start timing of the start target work.

9. The system according to claim 8, wherein in a case where the overlapping replenishment time window is a first overlapping time window of interest containing a latest time of the recommended work start time window, the processor is configured to specify a predetermined time earlier than the latest time within the first overlapping time window of interest as the replenishment work timing.

10. The system according to claim 8, wherein
the processor is configured to specify, for each of the plurality of ancillary work, a work end time in a case where the ancillary work is started at the work start timing, and in a case where the overlapping replenishment time window is a second overlapping time window of interest that is later than a latest time of the recommended work start time window of each of the plurality of ancillary work and also contains the work end time, the processor is configured to specify the work end time within the second overlapping time window of interest as the replenishment work timing.

11. The system according to claim 8, wherein
the processor is configured to specify, for each of the plurality of ancillary work, an estimated work end time at which the ancillary work is estimated to end in a case where the ancillary work is started at the latest time of the recommended work start time window, and in a case where the overlapping replenishment time window is a third overlapping time window of interest that is later than a latest time of the recommended work start time window of each of the plurality of ancillary work and also contains the estimated work end time, the processor is configured to specify the estimated work end time within the third overlapping time window of interest as the replenishment work timing.

12. The system according to claim 11 wherein the latest time of the recommended work start time window is set such that the estimated work end time matches a substrate type switch timing in the production of the component mounted substrate.

13. A component mounting system comprising:
a mounter that produces a component mounted substrate by mounting, onto a substrate, components supplied from a plurality of attached component supply devices into which a plurality of component storage members are loadable; and
a system that manages the plan for setup work for producing the component mounted substrate with respect to the mounter, the system comprising:
a work plan management system that manages a plan for setup work for producing the component mounted substrate, the work plan management system comprising a processor configured to:
   manage a plan for component replenishment work, the component replenishment work being setup work that replenishes each of the plurality of component supply devices with a new component storage member; and
   manage a plan for a plurality of ancillary work performed during the production of the component mounted substrate, the ancillary work being setup work other than the component replenishment work, wherein
   in order to manage the plan for component replenishment work, the processor is configured to:
      monitor a supply status of the components in each of the plurality of component supply devices, and specify, for each of the plurality of component supply devices, a replenishment possibility time window expressing a time window during which the component replenishment work is possible, and
      recognize an overlapping replenishment time window in which the replenishment possibility time windows overlap each other, and specify a component supply device for which the component replenishment work is possible within the overlapping replenishment time window as a component replenishment target device treated as a target of the component replenishment work, and
   in order to manage the plan for the plurality of ancillary work, the processor is further configured to:
      specify, for each of the plurality of ancillary work, a recommended work start time window expressing a time window in which the start of work is recommended, based on a work duration from a start until an end of each of the plurality of ancillary work, and
      specify, from among the plurality of ancillary work, ancillary work for which an earliest time of the overlapping replenishment time window is included in the recommended work start time window as start target work to be started within the overlapping replenishment time window; and
a mounter operation management device, the mounter operation management device being configured to control the mounter according to the plan for setup work for producing the component mounted substrate by mounting, onto the substrate, components supplied from the plurality of attached component supply devices into which the plurality of component storage members are loadable.

* * * * *